(12) United States Patent
Chen et al.

(10) Patent No.: US 10,193,098 B2
(45) Date of Patent: Jan. 29, 2019

(54) LIGHT EMITTING DEVICE MANUFACTURING METHOD AND APPARATUS THEREOF

(71) Applicant: INT TECH CO., LTD., Hsinchu County (TW)

(72) Inventors: Cheng-Hsin Chen, Hsinchu County (TW); Huei-Siou Chen, Taipei (TW); Li-Chen Wei, Taichung (TW)

(73) Assignee: INT TECH CO., LTD., Hsinchu County (TW)

( * ) Notice: Subject to any disclaimer, the term of this patent is extended or adjusted under 35 U.S.C. 154(b) by 0 days.

(21) Appl. No.: 15/995,838

(22) Filed: Jun. 1, 2018

(65) Prior Publication Data

US 2018/0294426 A1    Oct. 11, 2018

Related U.S. Application Data

(63) Continuation-in-part of application No. 15/695,853, filed on Sep. 5, 2017.

(60) Provisional application No. 62/420,089, filed on Nov. 10, 2016.

(51) Int. Cl.
| | |
|---|---|
| *H01L 51/56* | (2006.01) |
| *H01L 51/52* | (2006.01) |
| *H01L 27/32* | (2006.01) |
| *H01L 51/50* | (2006.01) |
| *H01L 51/00* | (2006.01) |

(52) U.S. Cl.
CPC ...... *H01L 51/5203* (2013.01); *H01L 27/3246* (2013.01); *H01L 51/0097* (2013.01); *H01L 51/5036* (2013.01); *H01L 51/5056* (2013.01); *H01L 51/5072* (2013.01); *H01L 51/5092* (2013.01); *H01L 51/56* (2013.01)

(58) Field of Classification Search
CPC ............. H01L 27/3246; H01L 51/5203; H01L 51/5056; H01L 51/5092; H01L 51/5036; H01L 51/56; H01L 51/5072; H01L 51/5262; H01L 51/0097; H01L 51/524; H01L 51/5096; H01L 51/5088; H01L 51/5253; G02B 6/0008; H05K 7/1481; H05K 7/1427; H05K 5/0217; H04L 12/40013
See application file for complete search history.

(56) References Cited

U.S. PATENT DOCUMENTS

| | | | |
|---|---|---|---|
| 6,905,784 B2 * | 6/2005 | Seo ..................... | H01L 51/0035 257/100 |
| 2013/0109117 A1 * | 5/2013 | Lee ..................... | H01L 51/5056 438/34 |
| 2016/0293675 A1 * | 10/2016 | Kim ..................... | H01L 27/3211 |
| 2016/0343940 A1 * | 11/2016 | Kong ................... | H01L 51/0005 |

(Continued)

*Primary Examiner* — Joseph L Williams
*Assistant Examiner* — Jose M Diaz
(74) *Attorney, Agent, or Firm* — WPAT, P.C., Intellectual Property Attorneys; Anthony King

(57) ABSTRACT

A method of manufacturing a light emitting device includes providing a substrate and forming a plurality of photosensitive bumps over the substrate. The method also includes forming a photosensitive layer over the plurality of photosensitive bumps and patterning the photosensitive layer to form a recess through the photosensitive layer to expose a surface. The method also includes disposing an organic emissive layer on the surface, and removing the patterned photosensitive layer.

31 Claims, 36 Drawing Sheets

(56) References Cited

U.S. PATENT DOCUMENTS

| | | | |
|---|---|---|---|
| 2017/0077188 A1* | 3/2017 | Kang | H01L 27/3211 |
| 2017/0125745 A1* | 5/2017 | Lee | H01L 27/3211 |
| 2017/0194396 A1* | 7/2017 | Choe | H01L 27/3211 |
| 2018/0138593 A1* | 5/2018 | Nakazawa | H01Q 21/06 |
| 2018/0151595 A1* | 5/2018 | Saitoh | H01L 29/7869 |
| 2018/0180995 A1* | 6/2018 | Choi | G03F 7/00 |
| 2018/0190907 A1* | 7/2018 | Kim | H01L 51/0016 |

* cited by examiner

LIGHT EMITTING DEVICE MANUFACTURING METHOD AND APPARATUS THEREOF

CROSS-REFERENCE TO RELATED APPLICATIONS

This application is a continuation-in-part application of a U.S. patent application entitled LIGHT EMITTING DEVICE MANUFACTURING METHOD AND APPARATUS THEREOF, Ser. No. 15/695,853, filed Sep. 5, 2017.

TECHNICAL FIELD

The present disclosure is related to light emitting device, especially to an organic light emitting device and manufacturing method thereof.

BACKGROUND

Organic light emitting display (OLED) has been used widely in most high end electron devices. However, due to the constraint of current technology, the pixel definition is realized by coating a light emitting material on a substrate through a mask, and often, the critical dimension on the mask can not be smaller than 100 microns. Therefore, pixel density having 800 ppi or higher becomes a difficult task for an OLED maker.

SUMMARY

In the present disclosure, the light emitting units are formed by a photo sensitive material. The photo sensitive material is directly disposed on a substrate without through a mask. The pixel definition is realized by a photolithography process.

A light emitting device includes a first type carrier transportation layer and an organic light emitting unit over the first type carrier transportation layer. The light emitting device further includes a second type carrier transportation layer over the organic light emitting unit, wherein the second type is opposite to the first type. At least one of the first type carrier transportation layer and the second type carrier transportation layer includes a metal element.

In some embodiments, the metal element is a transition metal. The organic light emitting unit has a width being not greater than 2 um. The organic light emitting unit is photo sensitive. The organic light emitting unit includes a footing extended laterally from the bottom of the organic light emitting unit. The organic light emitting unit includes a tapered sidewall and the tapered sidewall includes at least two different slopes.

A light emitting device includes a substrate and an array of organic light emitting units over the substrate. The light emitting device further has a secondary light emitting unit adjacent to one of the organic light emitting units in the array, wherein the secondary light emitting unit includes a second height and the one of the organic light emitting units in the array includes a first height, the second height is smaller than the first height.

In some embodiments, the light emitting device further includes a first type carrier transportation layer under the array of organic light emitting units and the secondary light emitting unit. The organic light emitting units in the array has a gap with an aspect ratio, wherein the aspect ratio is correlated to a height ratio between the secondary light emitting unit and an organic light emitting unit adjacent to the secondary light emitting unit. The secondary light emitting unit is in a strip shape, or in a circular shape. In some embodiments, the secondary light emitting unit is in a quadrilateral shape.

In some embodiments, the light emitting device further includes a second type carrier transportation layer over the array of organic light emitting units. The first or second type carrier transportation layer is a composite structure.

A method of manufacturing a light emitting device includes providing a substrate; forming a first type carrier transportation layer over the substrate; forming a metallic layer on the first type carrier transportation layer; treating the surface of the metallic layer thereby driving a metallic element from the metallic layer into the first type carrier transportation layer; forming a photo sensitive organic light emitting layer over the first type carrier transportation layer; and patterning the photo sensitive organic light emitting layer to form a light emitting unit.

In some embodiments, the metallic layer includes a transition metal or treating the surface of the metallic layer includes one of heating, microwave, or plasma treatment. In some embodiments, the method further includes a first type carrier injection layer between the first type carrier transportation layer and the substrate.

A method of manufacturing a light emitting device includes providing a substrate and forming a plurality of photosensitive bumps over the substrate. The method also includes forming a photosensitive layer over the plurality of photosensitive bumps and patterning the photosensitive layer to form a recess through the photosensitive layer to expose a surface. The method also includes disposing an organic emissive layer on the surface, and removing the patterned photosensitive layer. The method may further include forming a buffer layer between the photosensitive layer and the plurality of photosensitive bumps. The buffer layer is organic and includes fluorine. The method may further include removing a portion of the buffer layer to partially expose the plurality of photosensitive bumps. The method may further include forming a first electrode between the substrate and the plurality of photosensitive bumps. The first electrode is partially covered by the plurality of photosensitive bumps. The method may further include forming a first type carrier injection layer between the first electrode and the photosensitive layer. The method may further include forming a carrier transportation layer over the organic emissive layer.

A light emitting device includes a substrate and a plurality of bumps over the substrate and a plurality of light emitting units between the plurality of bumps and over the substrate. Each light emitting unit includes a first electrode and an organic emissive layer over the first electrode. The device further includes a common first type carrier injection layer between the first electrode and the organic emissive layer, the common first type carrier injection layer being shared by the plurality of light emitting units. The light emitting device may further include a first type carrier transportation layer between the first type carrier injection layer and the organic emissive layer. The first type carrier transportation layer is commonly shared by the plurality of light emitting units. The light emitting device may further include a second type carrier transportation layer over the organic emissive layer, wherein the second type carrier is opposite to the first type carrier. The second type carrier transportation layer is commonly shared by the plurality of light emitting units. The light emitting device may further include a second electrode over the organic emissive layer. The second electrode is commonly shared by the plurality of light emitting units. In some embodiments, the plurality of bumps are made with black material which absorbs over 90% of visible light. In some embodiments, the plurality of light emitting units are configured to emit at least two different colors.

DETAILED DESCRIPTION OF THE DISCLOSURE

The present disclosure provides a light emitting device, especially, organic light emitting device (OLED), and a method of manufacturing thereof. In the present disclosure, an organic light emitting layer in the OLED is formed by photo lithography. In some embodiments, the organic light emitting layer is a polymer light emitting layer. In some embodiments, the organic light emitting layer includes several light emitting pixels.

Figure 1:
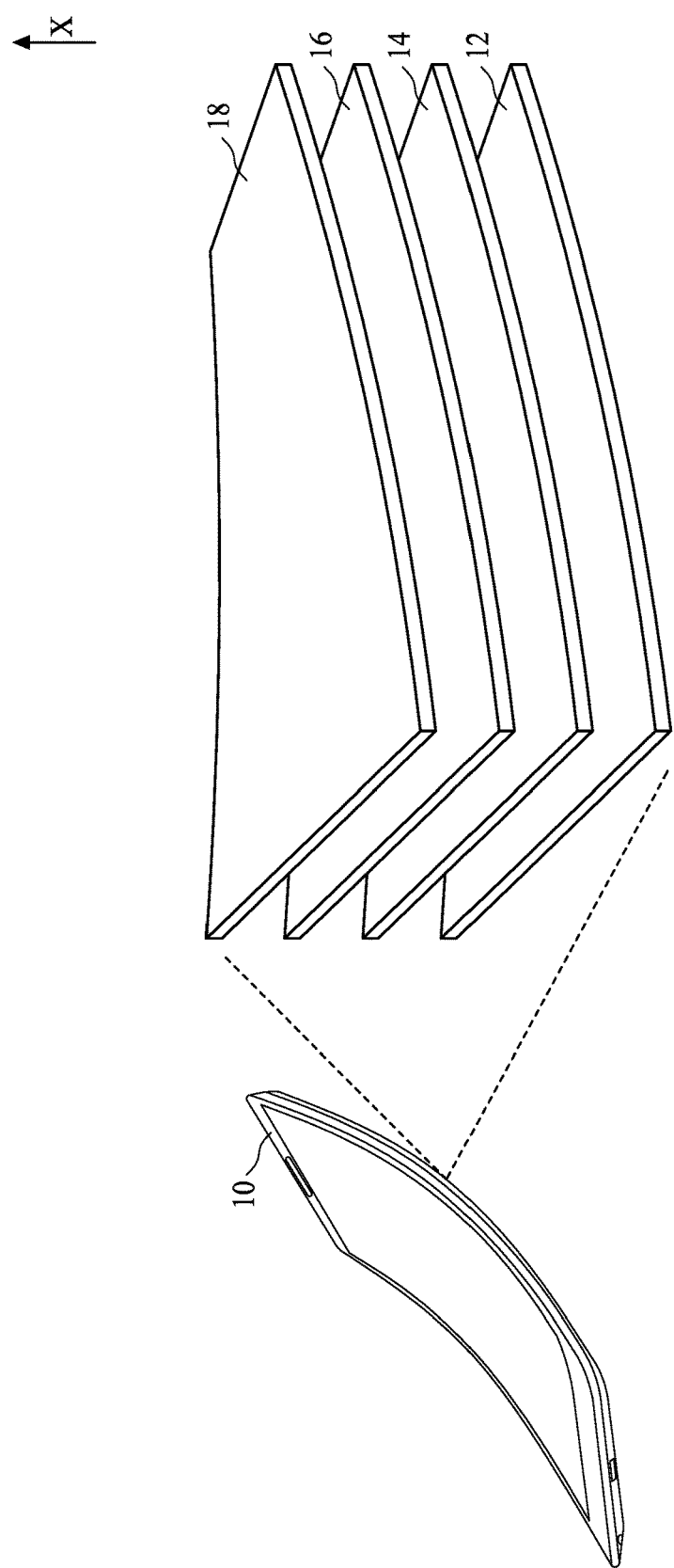
FIG. 1 is a flexible light emitting device.

FIG. 1 illustrates an embodiment of an electronic device 10. The electronic device 10 can be a rigid or a flexible display. Display 10 can have at least four different layers substantially stacked along a thickness direction X. Layer 12 is a substrate configured as a platform to have a light emitting layer 14 disposed thereon. Layer 16 is a cap layer to be disposed on the light emitting layer 14 and layer 18 is configured as a window for light emitting in/out the electronic device 10. In some embodiments, layer 16 is an encapsulation layer. Layer 18 can also be configured as a touch interface for the user, therefore the surface hardness of the might be high enough to meet the design requirement. In some embodiments, layer 16 and layer 18 are integrated into one layer.

Layer 12 might be formed with a polymer matrix material. Layer 12 has a bend radius being not greater than about 3 mm. In some embodiments, layer 12 has a minimum bend radius being not greater than 10 mm. The minimum bend radius is measured to the inside curvature, is the minimum radius one can bend layer 12 without kinking it, damaging it, or shortening its life. In some embodiments, several conductive traces may be disposed in layer 12 and form circuitry to provide current to the light emitting layer 14. In some embodiments, layer 12 includes graphene.

Figure 2:
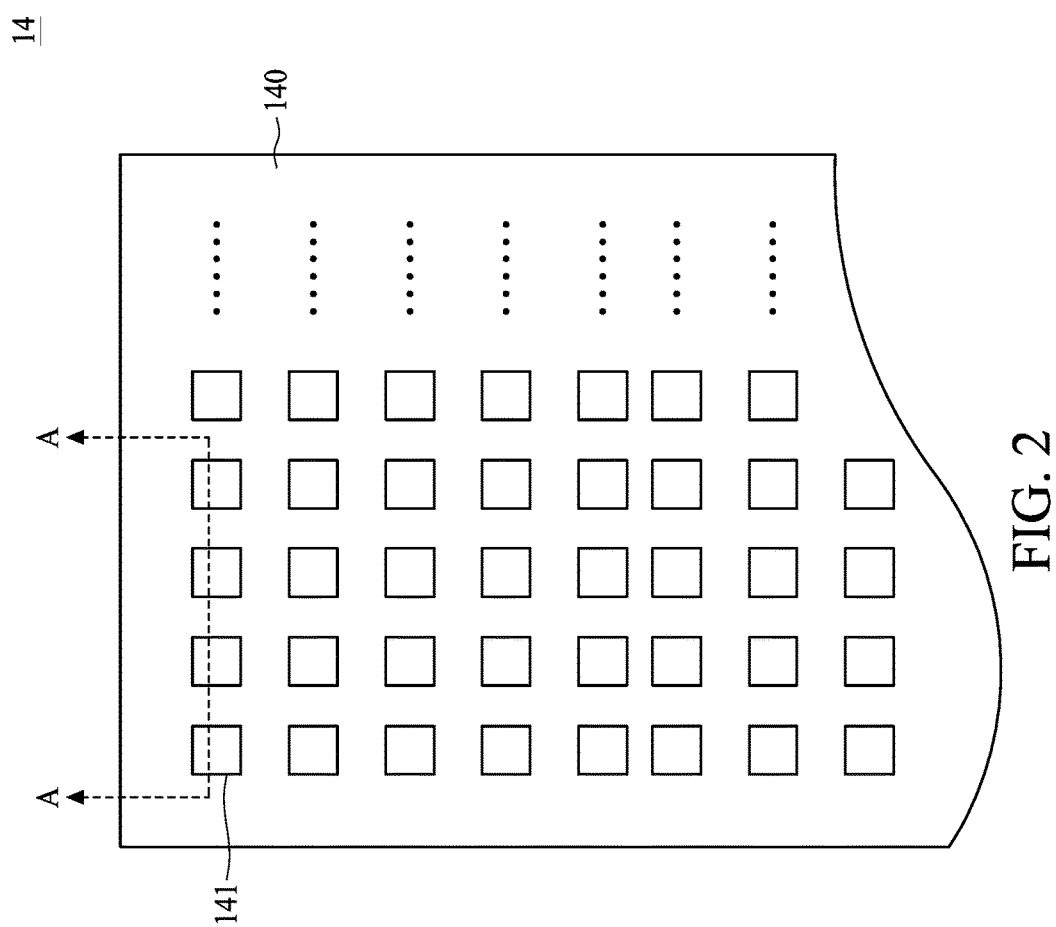
FIG. 2 is top view of a portion of a flexible light emitting device according to an embodiment.
Figure 3:
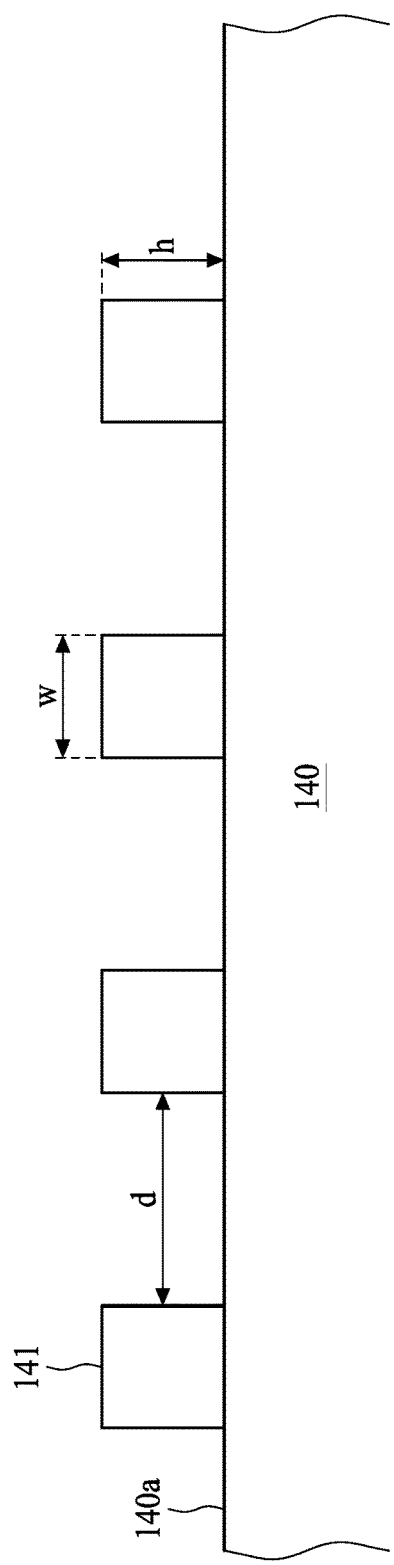
FIG. 3 is cross sectional view of a portion of a flexible light emitting device according to an embodiment.

Light emitting layer 14, can be configured as an array, as shown in FIG. 2, including many light emitting units. A cross sectional view of along ling AA is illustrated in FIG. 3. In some embodiments, the layer 14 has a substrate 140. In some embodiments, the substrate is configured to be able to provide current to the light emitting units. In some embodiments, the light emitting units 141 are configured as mesa disposed on the substrate 140. In some embodiments, the light emitting units are configured to be in recesses of the substrate 140. A thickness "h" of the light emitting units may range from about −100 um to about 100 um. The thickness h is measured from the surface 140a of the substrate 140. The negative value means the light emitting unit is disposed in the recess. Positive means light emitting unit protrudes like mesa shown in FIG. 3. The light emitting units can be arranged in an array. Each independent light emitting unit is separated from other adjacent light emitting units. A gap, d, represents a separation distance between two adjacent light emitting units. In some embodiments, gap, d, is between about 2 nm and about 100 um. In some embodiments, the gap, d, is controlled to be at least not greater than about 50 um so that the density of the units can be designed to be at least more than 700 ppi or 1200 ppi.

In some embodiments, a light emitting unit has a width, w, being between about 2 nm and about 500 um. The light emitting unit is a polymeric material. In some embodiments, the light emitting unit is photo sensitive. In some embodiments the width, w, is not greater than about 2 um.

Figure 4:
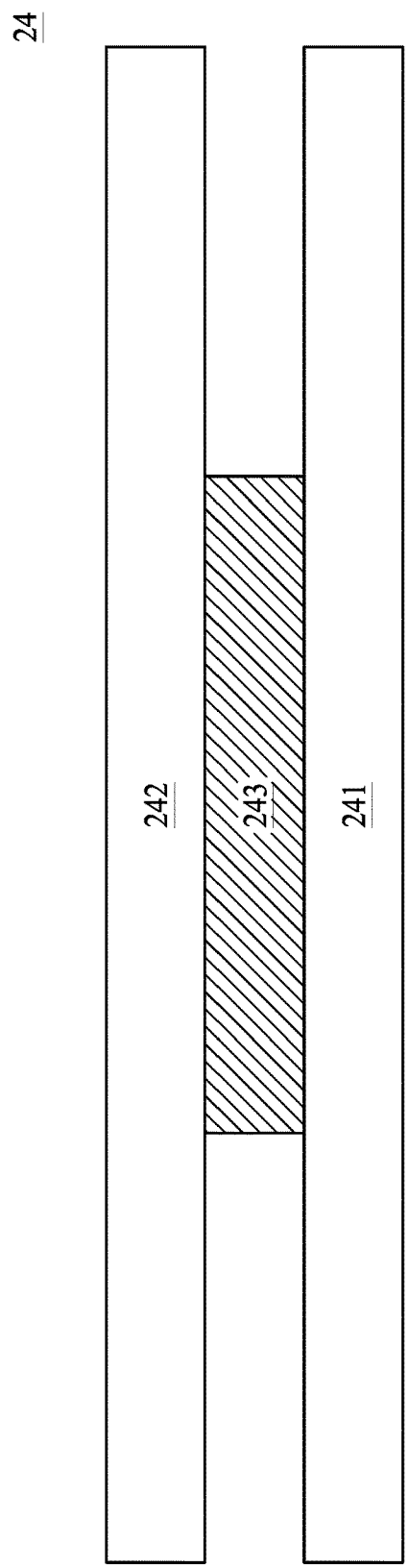
FIG. 4 is cross sectional view of a portion of a flexible light emitting device according to an embodiment.

FIG. 4 illustrates an embodiment of a light emitting pixel 24 in a light emitting layer from a crossectional view perspective. The light emitting pixel 24 includes a light emitting unit 243 as the light emitting unit in FIG. 3. Further, the light emitting pixel 24 includes a first type carrier transportation layer 241 and a second type carrier transportation layer 242. The first type is opposite to the second type. In some embodiments, the first type transportation layer 241 is a hole transportation layer (HTL) and the second type carrier transportation layer 242 is an electron transportation layer (ETL). In some embodiments, the first type transportation layer 241 is an electron transportation layer (ETL) and the second type carrier transportation layer 242 is a hole transportation layer (HTL).

In some embodiments, trace of metal is found in the first type carrier transportation layer 241 or the second type carrier transportation layer 242. Moreover, metal element may appear first type carrier transportation layer 241 or the second type carrier transportation layer 242. The metal element includes transition metal. In some embodiments, the metal element includes at one of the elements, Y, Zr, Nb, Mo, Ru, Rh, Cd, Hf, Ta, W, Re, Os.

In some embodiments, the light emitting unit 243 is in contact with the first type transportation layer 241. In some embodiments, the light emitting unit 243 is in contact with the second type transportation layer 242. In some embodiments, an intermediate layer is between the light emitting unit 243 and the first type transportation layer 241. In some embodiments, an intermediate layer is between the light emitting unit 243 and the second type transportation layer 242.

Figure 5:
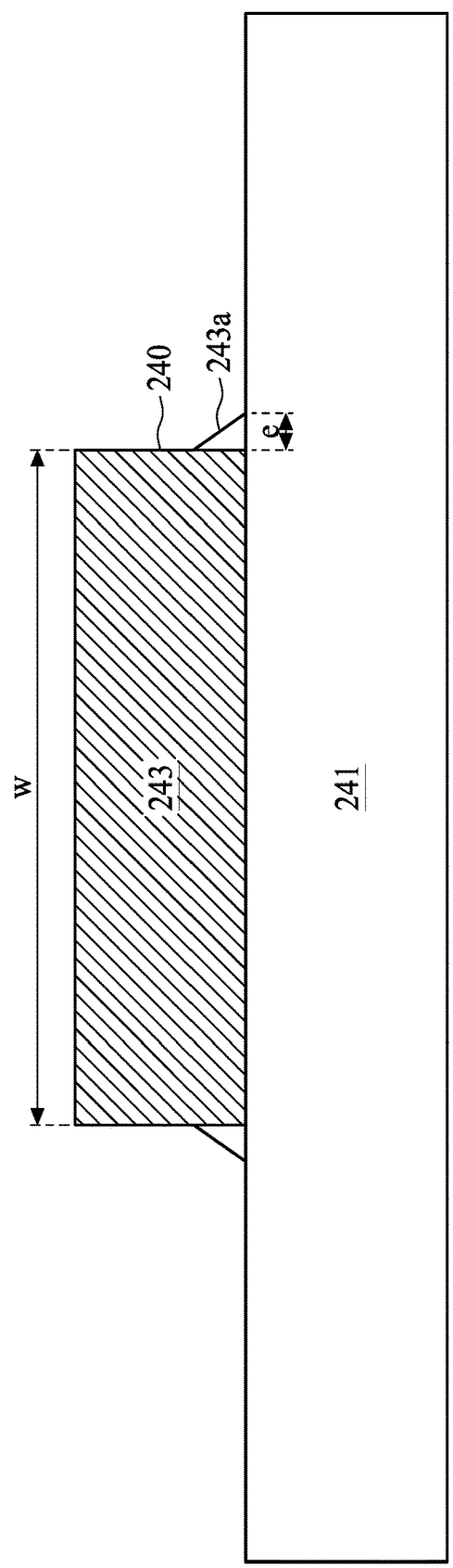
FIG. 5 is cross sectional view of a portion of a flexible light emitting device according to an embodiment.

FIG. 5 is an enlarged view of the light emitting unit 243 in FIG. 4 in according to some embodiments. The light emitting unit 243 has a footing 243a extended laterally from the sidewall 240 of the light emitting unit 243. The footing 243a is in contact with the first type transportation layer 241. The lateral extension of the footing 243a has a width, e, which is measured from the sidewall 240 to the tip of the footing 243a. The tip is farthest point where the footing 243a can extend. The tip is also the end point where the footing meets the first type transportation layer 241.

Figure 6:
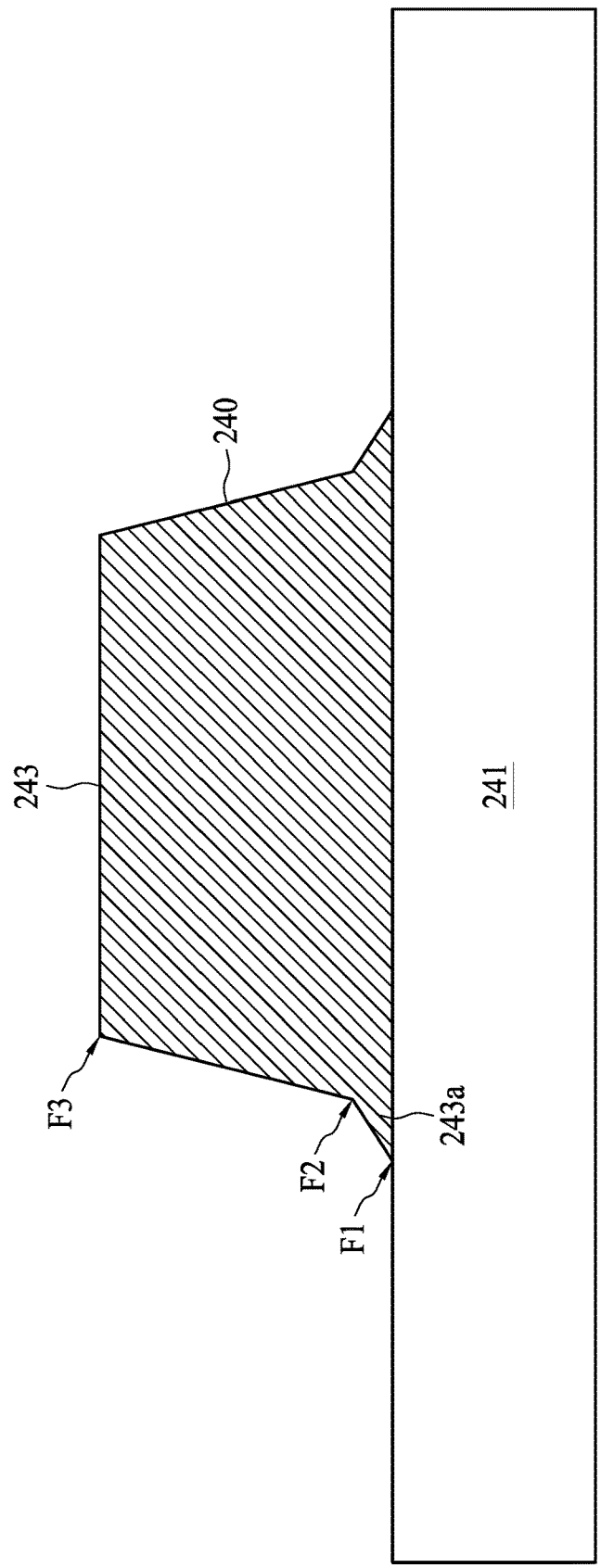
FIG. 6 is cross sectional view of a portion of a flexible light emitting device according to an embodiment.
Figure 7:
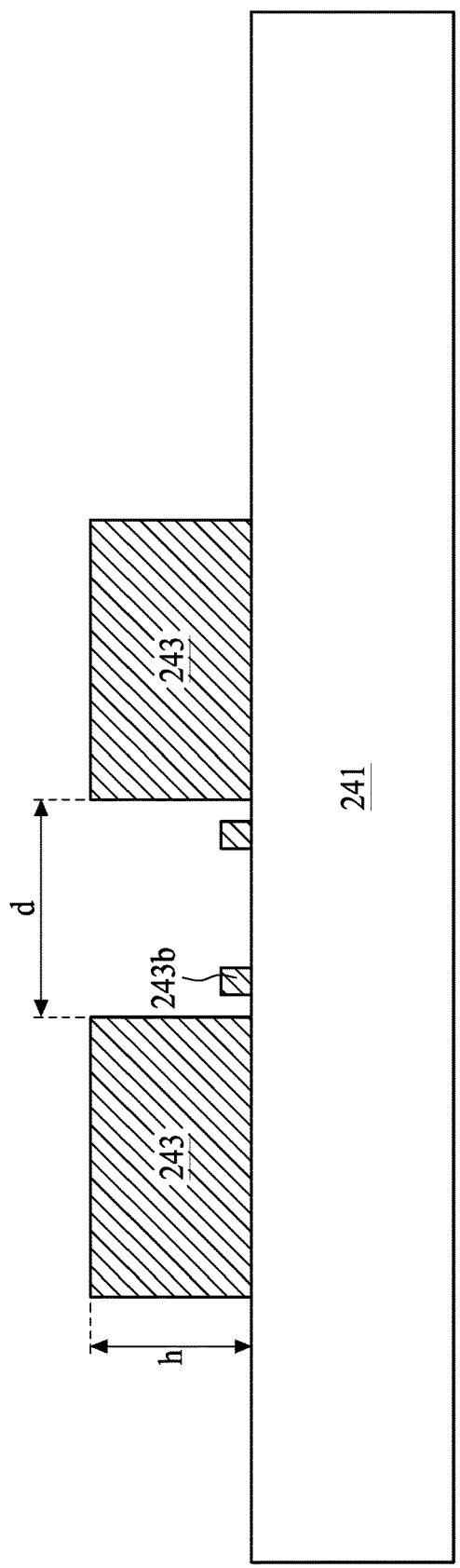
FIG. 7 is cross sectional view of a portion of a flexible light emitting device according to an embodiment.

FIG. 6 illustrates another embodiment of a light emitting unit 243 in FIG. 4. The sidewall 240 of the light emitting unit is tapered and has two different slopes. The first slope is measured from the tip F1 of the footing 243a to the turning point F2. The second slope is measured from the turning point F2 to the top corner F3 of the light emitting unit 243. In some embodiments, the second slope is greater than the first slope.

One of the purposes to have a footing 243a extended from the bottom of the light emitting unit 243 is to increase the adhesion between the light emitting unit 243 and the first type transportation layer 241. Because the light emitting unit 243 and the first type transportation layer 241 may be formed with different materials, the surface tension between the light emitting unit 243 and the first type transportation layer 241 may cause undesired peeling. With the footing 243a, the contact surface between the light emitting unit 243 and the first type transportation layer 241 is increased to secure the light emitting unit 243 sitting on the first type transportation layer 241.

In some embodiments, there are some secondary light emitting unit 243b disposed between two adjacent light emitting unit 243. The secondary light emitting unit 243b has a height that is smaller than the height, h, of the light emitting unit 243. The secondary light emitting unit 243b is isolated from the light emitting unit 243. In some embodiments, the height of the secondary light emitting unit 243b is about $1/5$ to about $1/15$ of the height of the light emitting unit 243.

In some embodiments, the light emitting unit 243 and an adjacent secondary light emitting unit 243b emit a light with a same wavelength. In some embodiments, some light emitting units are designed to emit a light with a first wavelength. Some light emitting units are designed to emit a light with a second wavelength, which is different from the first wavelength. Some light emitting units are designed to emit a light with a third wavelength, which is different from the first wavelength and the second wavelength. One light emitting unit may be assigned to have a secondary light emitting unit disposed adjacent to the light emitting unit and the assigned secondary light emitting unit emits a light with the same wavelength as the corresponding light emitting unit.

Figure 8:
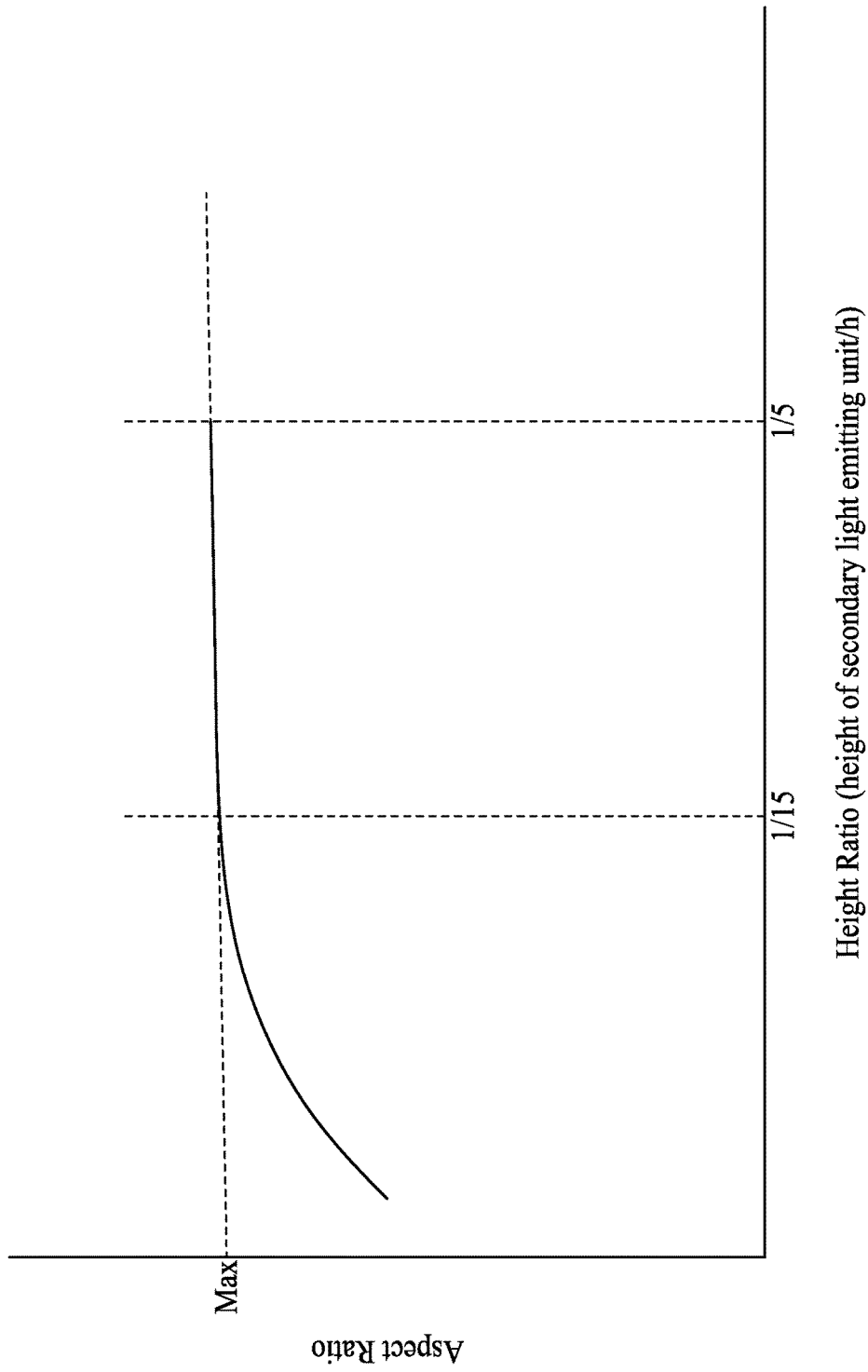
FIG. 8 illustrates a correlation between the aspect ratio and height ratio.

Aspect ratio of light emitting unit 243 is defined as the height h of the light emitting unit 243 divided by the gap, d, between two adjacent light emitting units. As shown in FIG. 8, when the height ratio between the secondary light emitting unit 243b and the light emitting unit 243 reaches $1/15$, the aspect ratio start entering into a saturation zone until the height ratio reaches $1/5$. For an ultra-high PPI (>1200 ppi) display, the designer can adjust the height ratio between the secondary light emitting unit 243b and the light emitting unit 243 in order to meet the requirement of the aspect ratio.

Figure 9:
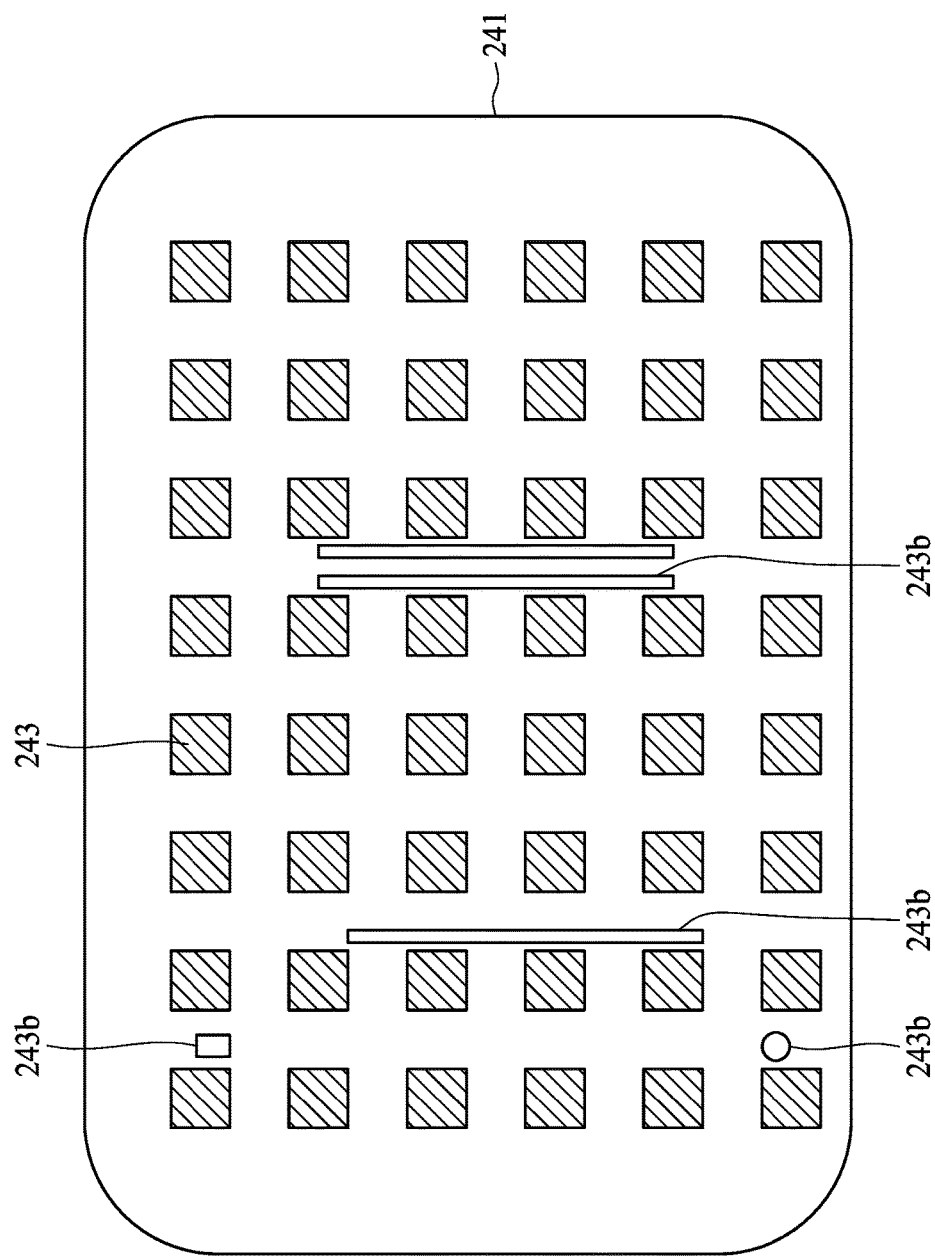
FIG. 9 is top view of a portion of a flexible light emitting device according to an embodiment.

FIG. 9 is a top view of an embodiment of an array of light emitting unit 243 disposed on a first type transportation layer 241. The secondary light emitting unit 243b can be formed as in quadrilateral, circle, or a strip shape.

In some embodiments, a secondary light emitting unit 243b is formed to be in corresponding to only one pair of light emitting units 243. The secondary light emitting unit 243b is designed to improve the aspect ratio of the gap between of the pair of light emitting units 243. In some embodiments, a circular shaped secondary light emitting unit 243b may increase the maximum aspect ratio (Max in FIG. 8) to be 10% to 15% higher than a quadrilateral one.

In some embodiments, a secondary light emitting unit 243b is formed to be in corresponding to several pairs of light emitting units 243 Like the one in a strip pattern at left side, the strip-like secondary light emitting unit 243b is designed to be corresponding to at least three different pairs of light emitting units 243.

In some embodiments, there are at least two separate secondary light emitting units 243b formed to be in corresponding to several pairs of light emitting units 243. As the two strip-like light emitting units 243b at the right side, there are two secondary light emitting strips in parallel.

Figure 10:
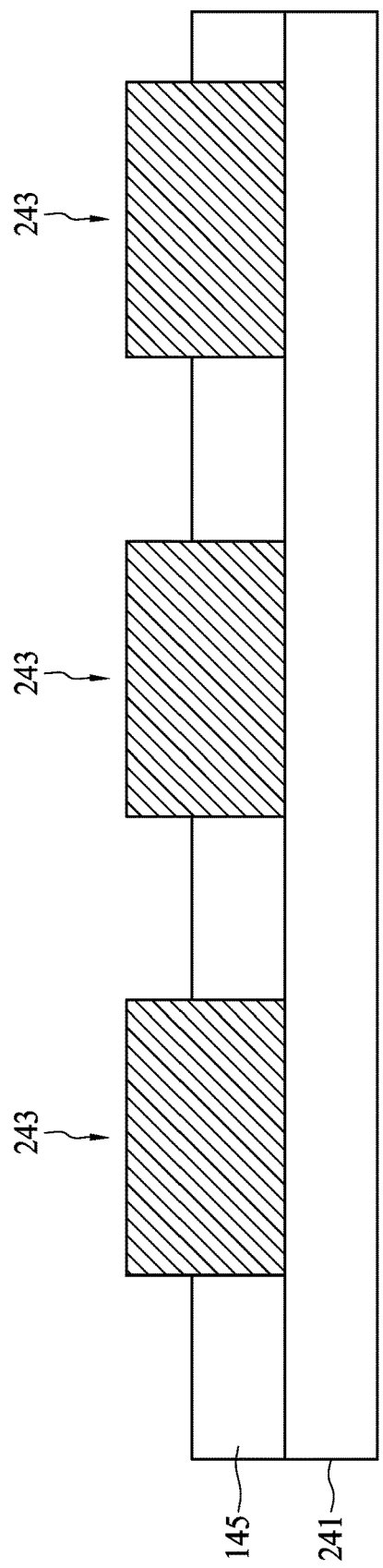
FIG. 10 cross sectional view of a portion of a flexible light emitting device according to an embodiment.

In order to minimize the interference between adjacent light emitting units 243, an absorption material 145 can be used to fill the gaps between light emitting units 243 as shown in FIG. 10. The absorption material 145 can absorb the light emitted from the light emitting units 243 and any visible light entering into the device from ambient.

Figure 11:
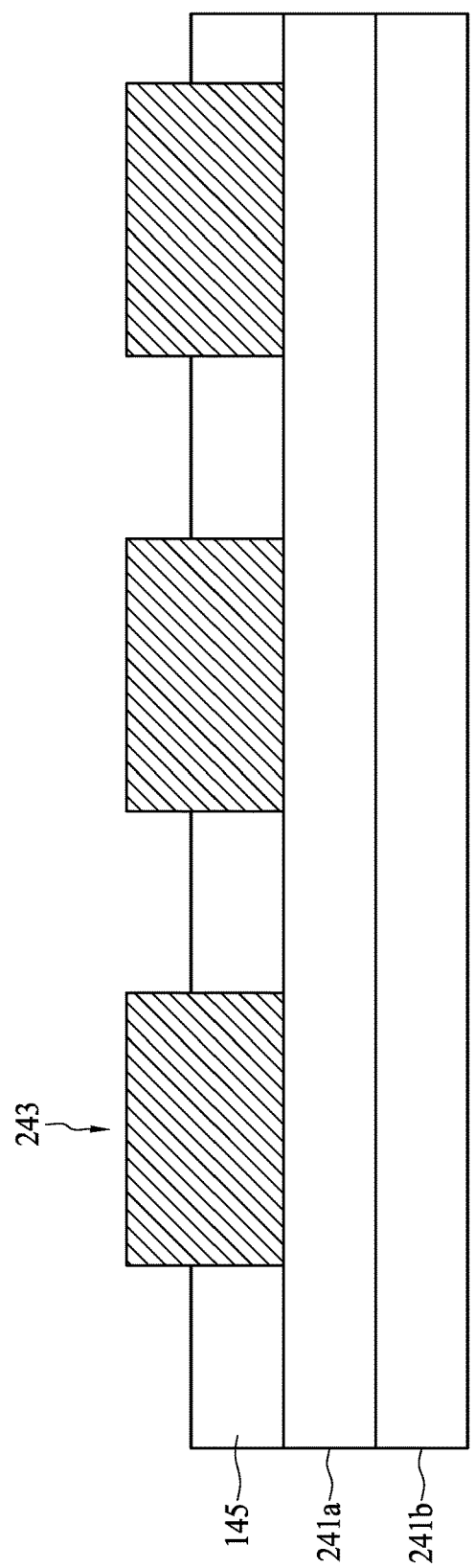
FIG. 11 is cross sectional view of a portion of a flexible light emitting device according to an embodiment.

In some embodiments, the first type carrier transportation layer 241 is a composite structure and includes at least a primary layer 241a and a secondary transportation layer 241b as in FIG. 11. The trace of metal is found in any one sub-layer of the first type carrier transportation layer 241. The metal element includes transition metal. In some embodiments, the metal element includes at one of the elements, Y, Zr, Nb, Mo, Ru, Rh, Cd, Hf, Ta, W, Re, Os.

Similarly, in some embodiments, the second type carrier transportation layer 242 is a composite structure and includes at least a primary layer and a secondary transportation layer. The trace of metal is found in any one sub-layer of the second type carrier transportation layer 242. The metal element includes transition metal. In some embodiments, the metal element includes at one of the elements, Y, Zr, Nb, Mo, Ru, Rh, Cd, Hf, Ta, W, Re, Os. In some embodiments, layer 606 or 306 may include Cs, Rb, K, Na, Li, Yb, Lu, Tm, etc.

Figure 12:
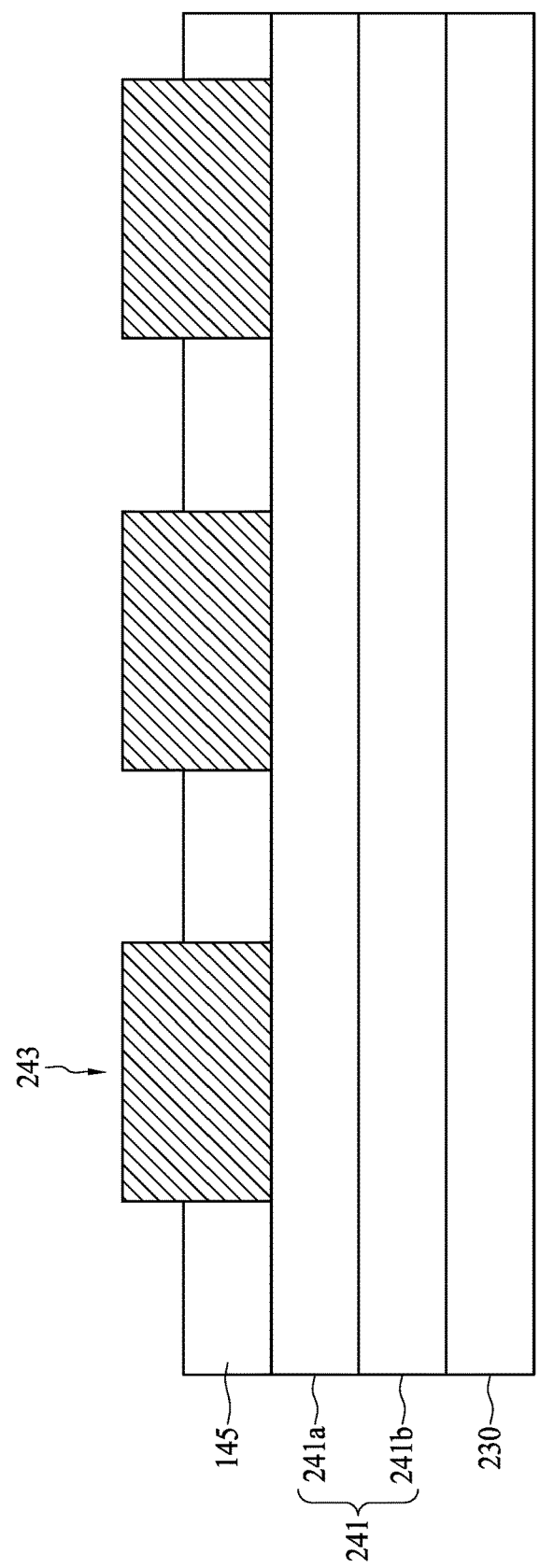
FIG. 12 is cross sectional view of a portion of a flexible light emitting device according to an embodiment.

In some embodiments, there is a first type carrier injection layer adjacent to the first type carrier transportation layer. As in FIG. 12, the first type carrier injection layer 230 is adjacent to the first type carrier transportation layer 241. Similarly, there is a second type carrier injection layer adjacent to the second type carrier transportation layer.

Figure 13A:
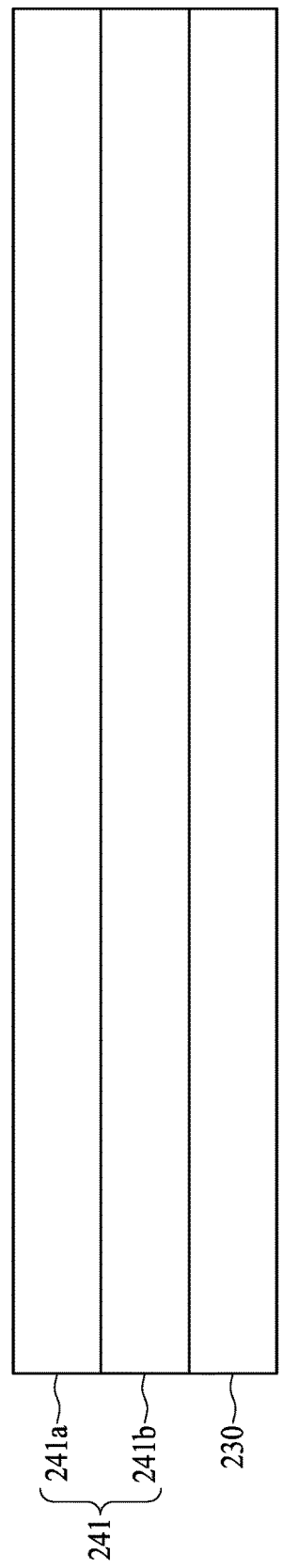
FIG. 13A-13E illustrate an operation of manufacturing a flexible light emitting device according to an embodiment.
Figure 13B:
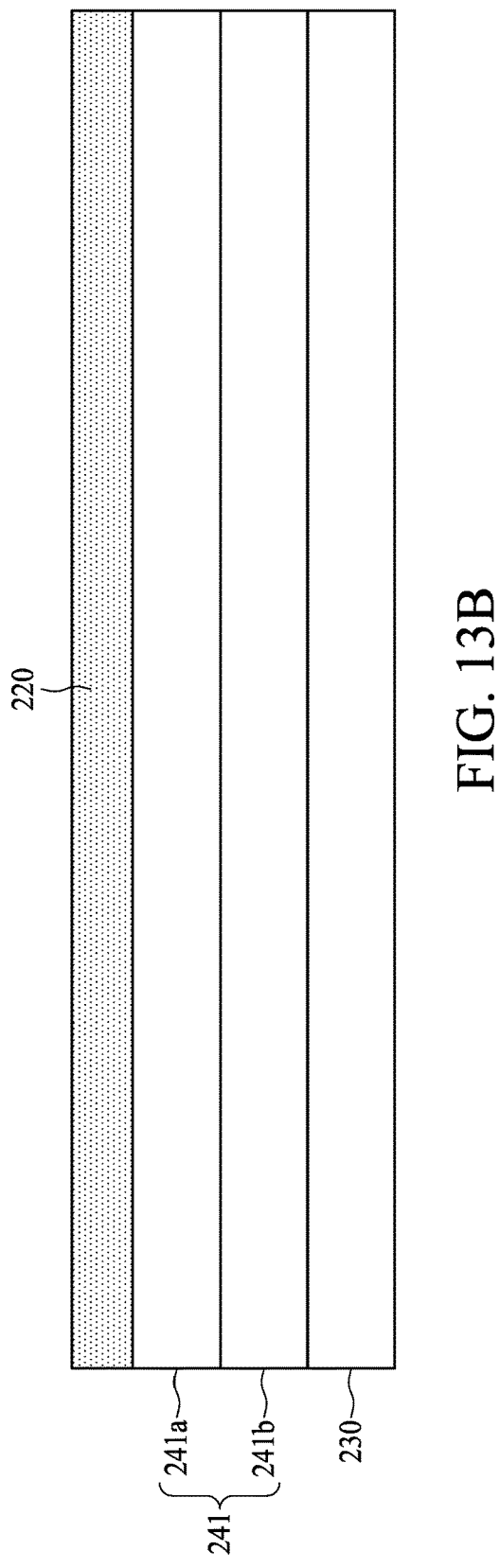
Figure 13C:
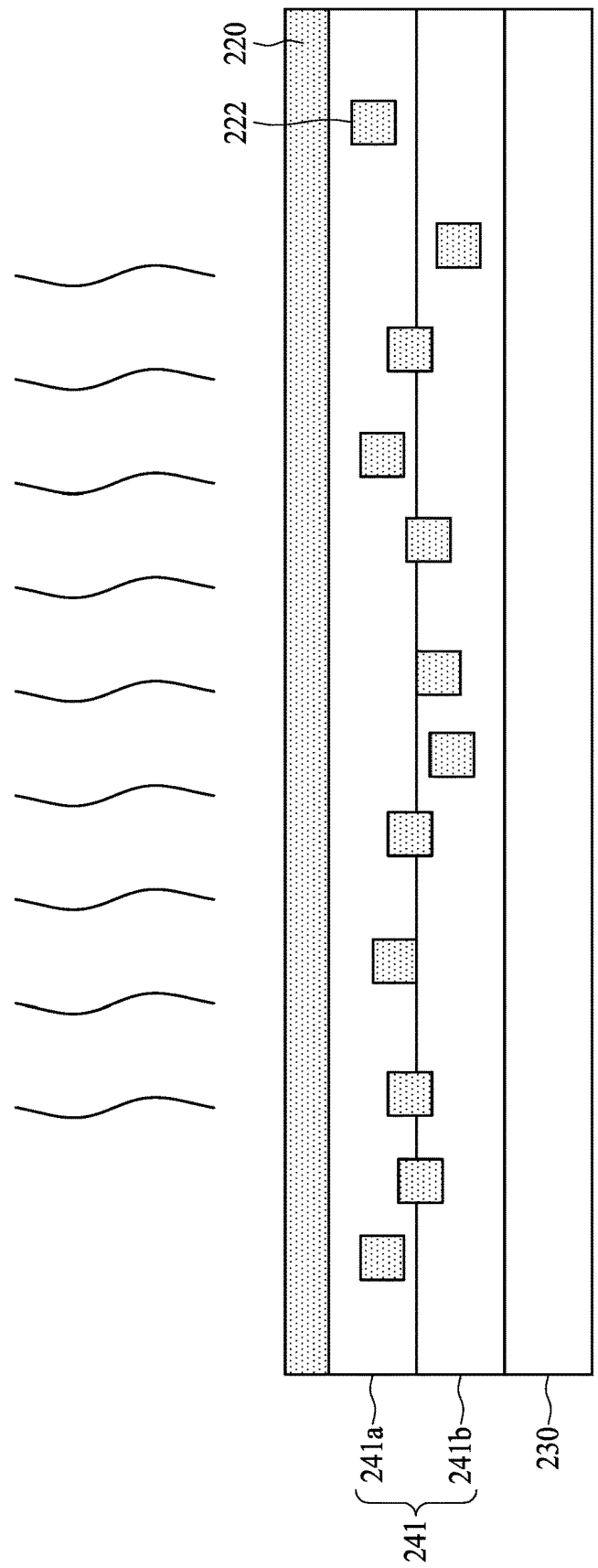

FIG. 13A-13C illustrate some operations of manufacturing a light emitting device. In FIG. 13A, a substrate including a first type carrier injection layer 230 and a composite first type carrier transportation layer is provided.

In FIG. 13B, a metal or metal complex layer 220 is disposed on the composite first type carrier transportation layer. The metal complex layer can be formed by various deposition processes such as, vapor deposition, sputtering, atomic layer deposition (ALD), heat evaporation, coating, or jetting. In some embodiments, the thickness of layer 220 is about 30 Å or less. Layer 220 may include oxygen, nitrogen, argon, fluorine, carbon, etc.

A treatment process is introduced in FIG. 13C. The treatment process can be performed by heating, microwave, plasma treatment. The treatment is applied directly on layer 220. During the treatment, layer 220 is broken down such that transitional metal element 222 in layer 220 can penetrate into the first type carrier transportation layer 241. In some embodiments, the distribution of the transitional metal element 222 may have a gradient. In some embodiments, a density of the transitional metal element 222 at the top surface of the first type carrier transportation layer 241 is higher than a density at a location proximal to the interface between first type carrier transportation layer 241 and the first type carrier injection layer 230. Similarly, the above metal diffusion operation can be applied to the second type carrier transportation layer.

Figure 13D:
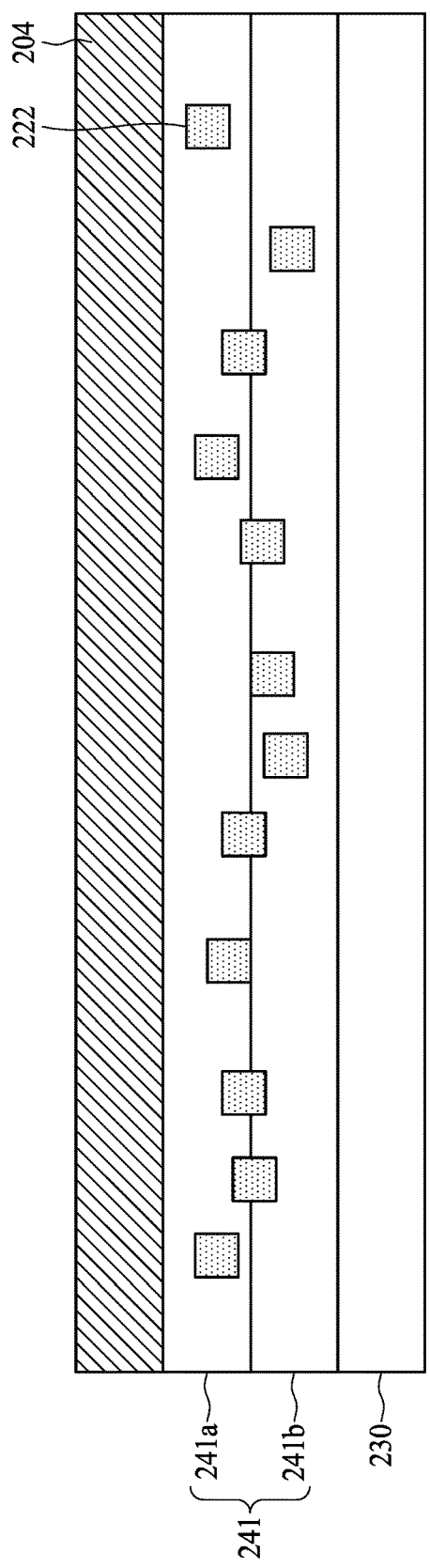

After the treatment, the layer 220 may disappear or be removed from the surface of the first type carrier transportation layer 241. A photo sensitive organic light emitting layer 204 is disposed over the first type carrier transportation layer 241 after the treatment or removal process as in FIG. 13D.

Figure 13E:
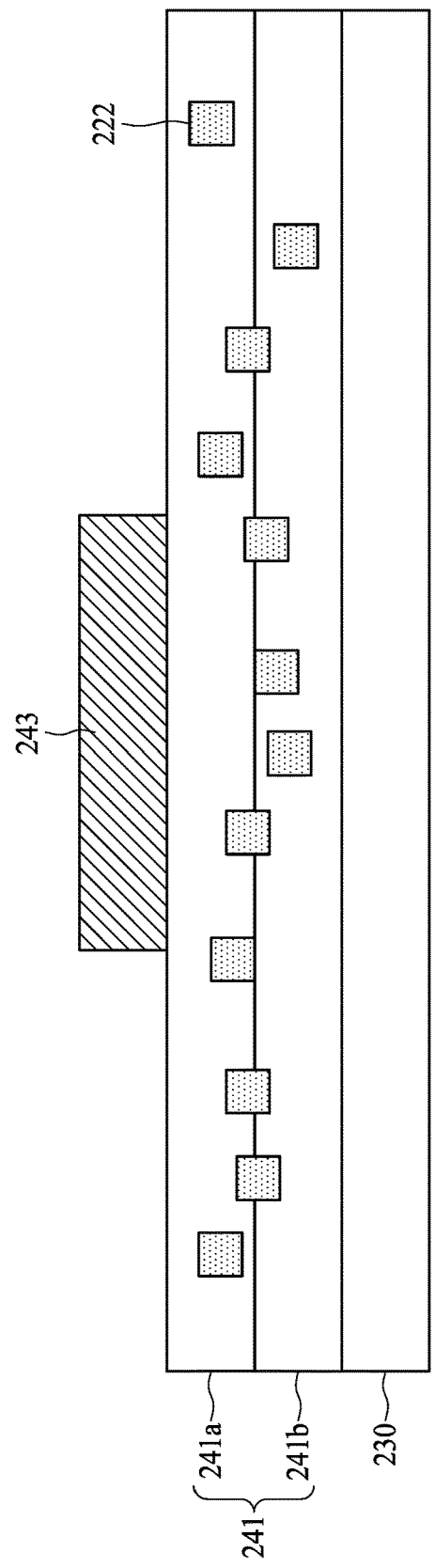

In FIG. 13E, a patterning process, such as photolithography, is introduced to remove excessive portion and form a light emitting unit 243.

Figure 14A:
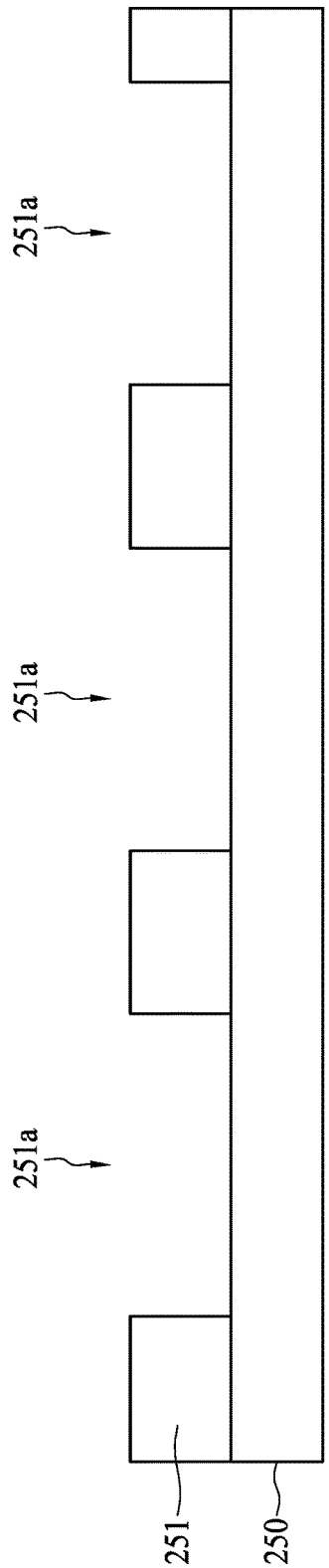
FIG. 14A-14D illustrate a method of manufacturing a light emitting device according to an embodiment.

FIG. 14A-FIG. 14D illustrate another embodiment to form light emitting units 243 on a substrate 250. In some embodiments, the substrate 250 includes a carrier transportation layer. In some embodiments, the substrate 250 includes a TFT (thin film transistor) array. In FIG. 14A, a patterned photosensitive layer 251 is formed on the substrate 250. In some embodiments, the patterned photosensitive layer 251 is a photo absorption material as the photo absorption material 145 in FIG. 10. In some embodiments, the patterned photosensitive layer 251 is used as a pattern defined layer. A region 251a is defined by two adjacent patterned photosensitive mesas and the region 251a is configured to receive an organic light emitting unit. In some embodiments, the patterned photosensitive layer 251 is fluorine free, i.e. substantially contains no fluorine.

Figure 14B:
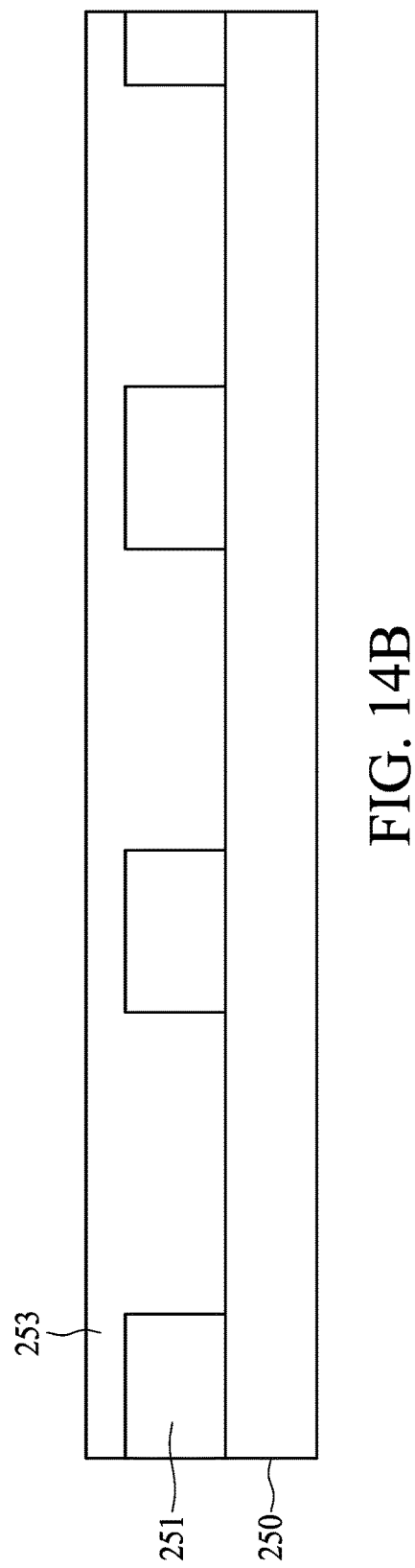
Figure 14C:
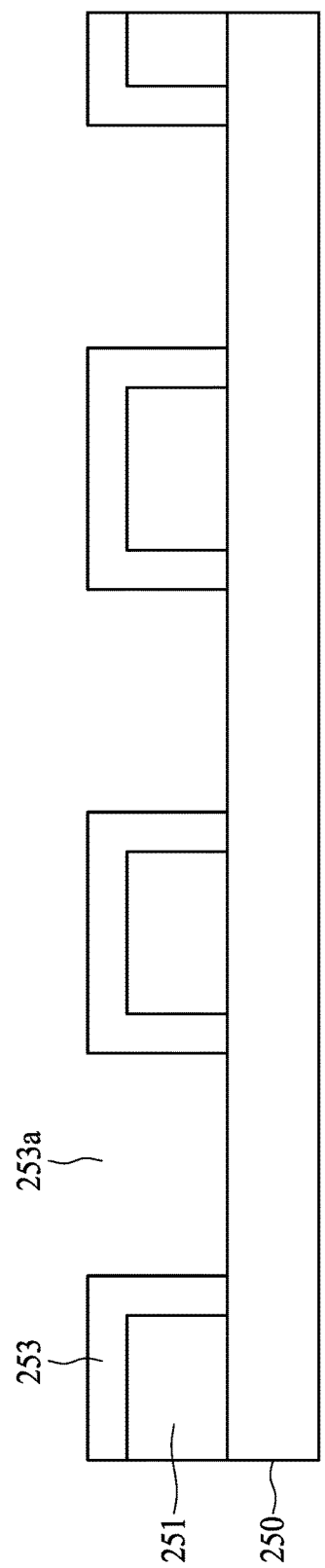
Figure 14D:
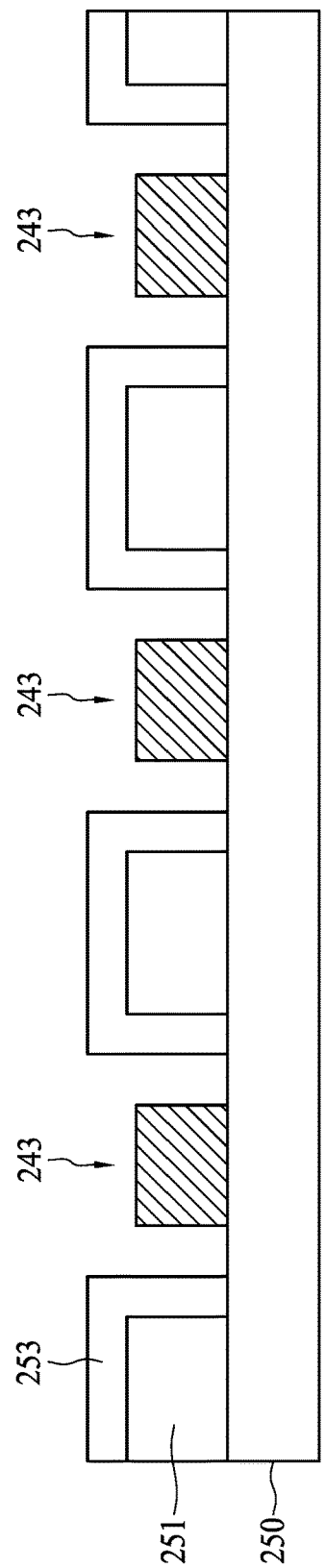

In FIG. 14B, a photo resist layer 253 is disposed over the photosensitive layer 251 and in the region 251a. In some embodiments, the photo resist layer 253 contains fluorine. In FIG. 14C, the photo resist layer 253 is patterned to have several openings 253a. In some embodiments, each opening 253a has a width less than about 10 um. In FIG. 14D, an organic light emitting unit 243 is formed in the opening 253a. In some embodiments, the organic light emitting unit 243 has a height that is smaller than a height of the photosensitive layer 251. The photo resist layer 253 can be removed in another step (not shown in the drawings).

Figure 15A:
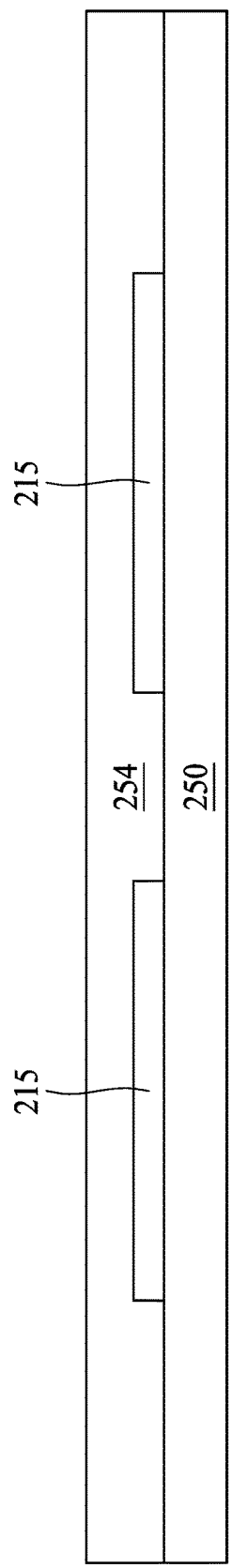
FIG. 15A-15F illustrate a method of manufacturing a light emitting device according to an embodiment.

In FIG. 15A, a substrate 250 is provided, the substrate 250 may include a TFT (thin film transistor) array. Several first electrode 215 are disposed over the substrate 250. Each first electrode 215 is configured to be connected to a circuit embedded in the substrate 250 at one side and to be in contact with a light emitting material at the other side. The pattern of the first electrode array is designed for the pixel arrangement. A photosensitive layer 254 is disposed over the first electrodes 215 and the substrate 250. In some embodiments, the photosensitive layer 254 is spin-coated over the first electrodes 215 and the substrate 250.

Figure 15B:
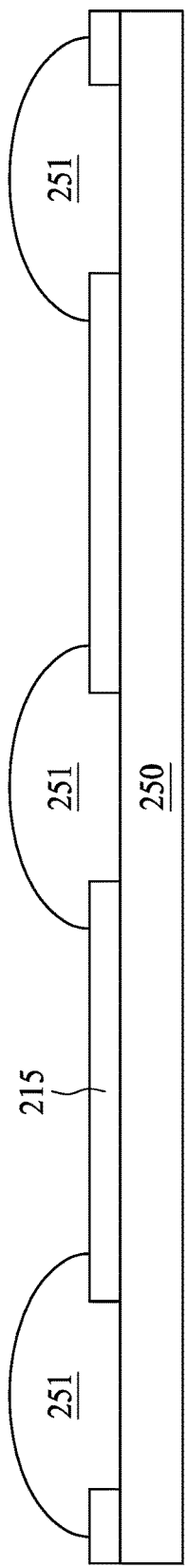

The photosensitive layer 254 fills into the gap between adjacent first electrodes. The photosensitive layer 254 is heated to a predetermined temperature then exposed under a designated wavelength. The photosensitive layer 254 may absorb over 90% of the visible light and is also called black material in the present disclosure. After exposure, the photosensitive layer 254 is rinsed in a solution for development. A portion of the photosensitive layer 254 is removed and the remaining portion is substantially covering the gap between adjacent first electrodes as shown in FIG. 15B. In the cross sectional view, the remaining photosensitive layer 254 form several bumps 251, each bump 251 fills the gap of two adjacent first electrodes. Each first electrode 215 is partially covered by the bump 251. The patterned bumps 251 are also called pixel defined layer (PDL).

The bump 251 can be formed in different types of shape. In FIG. 15B, the bump 251 has a curved surface. In some embodiments, the shape of bump 251 is tapezoid. After the bumps 251 formed, a cleaning operation is performed to clean the exposed surfaces of the bumps 251 and the first electrodes 215. In one embodiment, during the cleaing operation, a DI (De-Ionized) water is heated to a temperature between 30° C. and 80° C. After the temperture of DI water is elevated to a predetermined temperature then is introduced to the exposed surfaces of the bumps 251 and the first electrodes 215.

In some embodiments, ultrsonic is used during the cleaning operation. The ultrasoic is introduced into the cleaning agent, such as water or IPA, etc. In some embodiments, carbon dioxide is introduced into the cleaning agent. After the cleaning operation, the cleaning agent is removed from the exposed surfaces via a heating operation. During the heating operation, the substrate 250 and the bump 251 may be heated to a temperature between about 80° C. and 110° C. In some cases, an compressed air is introduced to the exposed surfaces to help remove the residue of clean agent while heating.

After the heating operation, the exposed surfaces may be treated with an $O_2$, $N_2$, or Ar plasma. The plasma is used to roughened the exposed surfaces. In some embodiments, an ozone gas is used to adjust the surface condition of the exposed surfaces.

Figure 15C:
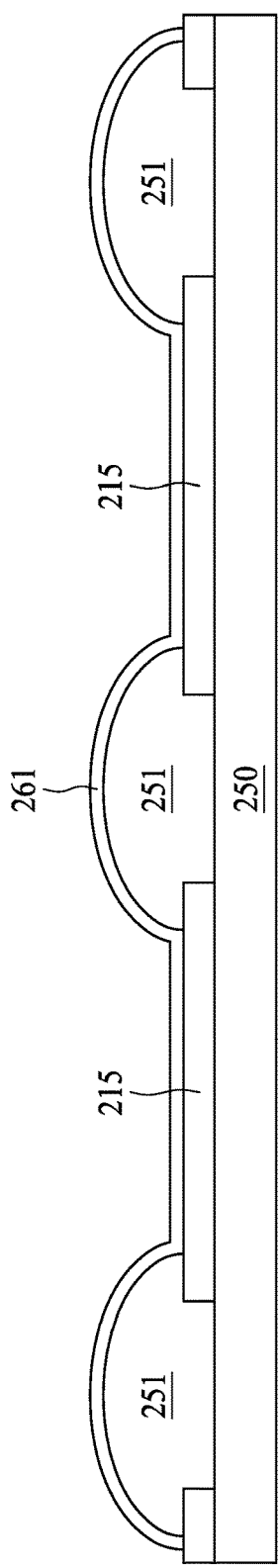

A carrier injection layer 261 is disposed over the exposed surfaces of the bumps 251 and the first electrodes 215 as in FIG. 15C. The carrier injection layer 261 is continuously lining along the exposed surfaces. More specifically, the exposed surface of each first electrode 215 is configured as an effective light emitting area for one light emitting unit. In this embodiment, all light emitting units use a common carrier injection layer 261. In some embodiments, layer 261 is for hole injection. In some embodiments, layer 261 is for electron injection. The carrier injection layer 261 continuously overlies several PDL bumps 251 and first electrodes 215. Optionally, the carrier injection layer 261 is in contact with the PDL bumps 251. In one embodiment, the carrier injection layer 261 is in contact with the first electrodes 215. In some embodiments, the carrier injection layer 261 is organic.

Figure 15D:
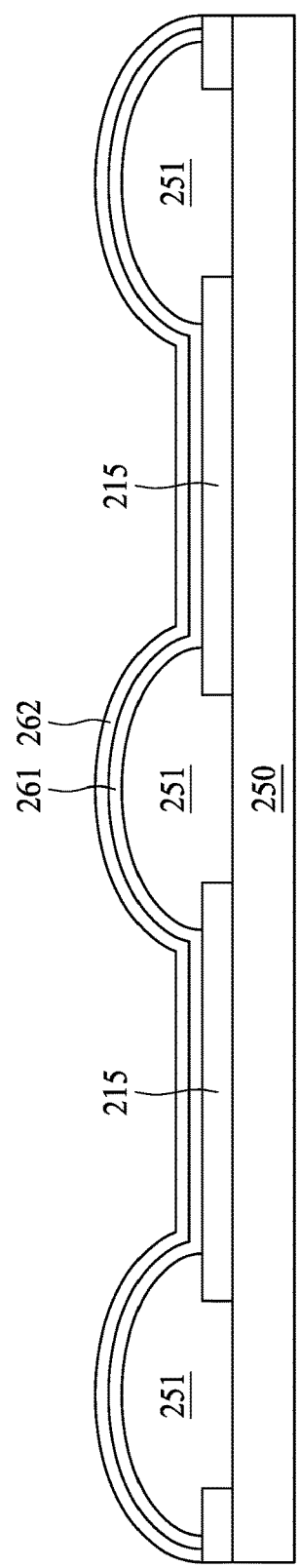

A carrier transportation layer 262 (or called first type carrier transportation layer) is disposed over the exposed surfaces of the bumps 251 and the first electrodes 215 as in FIG. 15D. The carrier injection layer 261 is disposed under the carrier transportation layer 262. The carrier transportation layer 262 is continuously lining along the carrier transportation layer 262. In this embodiment, all light emitting units use a common carrier transportation layer 262. In some embodiments, layer 262 is for hole transportation. In some embodiments, layer 262 is for electron transportation. The carrier transportation layer 262 continuously overlies several PDL bumps 251 and first electrodes 215. Optionally, the carrier transportation layer 262 is in contact with the carrier injection layer 261. In some embodiments, the carrier transportation layer 262 is organic.

Figure 15E:
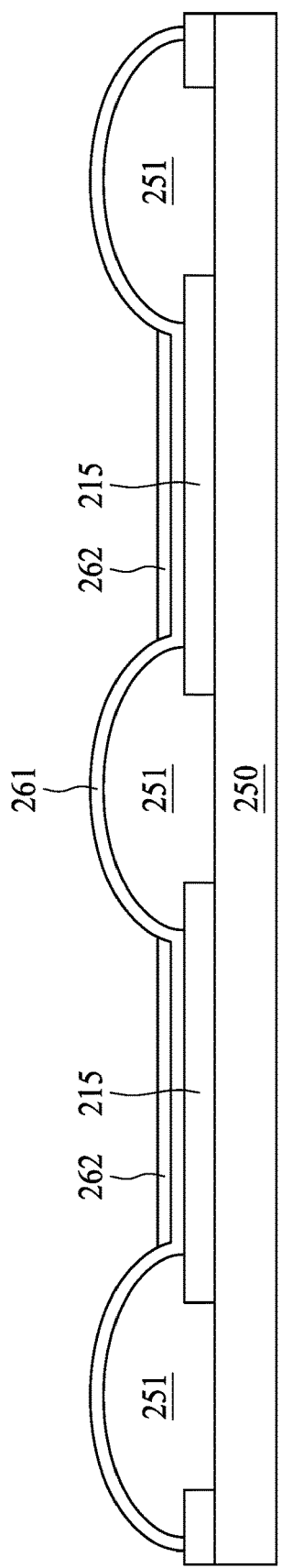

In some embodiments, the carrier transportation layer 262 is configured to be broken into segements and the carrier injection layer 261 is continuously lining along the exposed PDL bumps and first electrodes as shown in FIG. 15E. Each segment is vertically aligned to a first electrode 215. In other words, the carrier transportation layer 262 is not continuously lining along the carrier injection layer 261. Each light emitting unit has a separate carrier transportation layer disposed thereon.

Figure 15F:
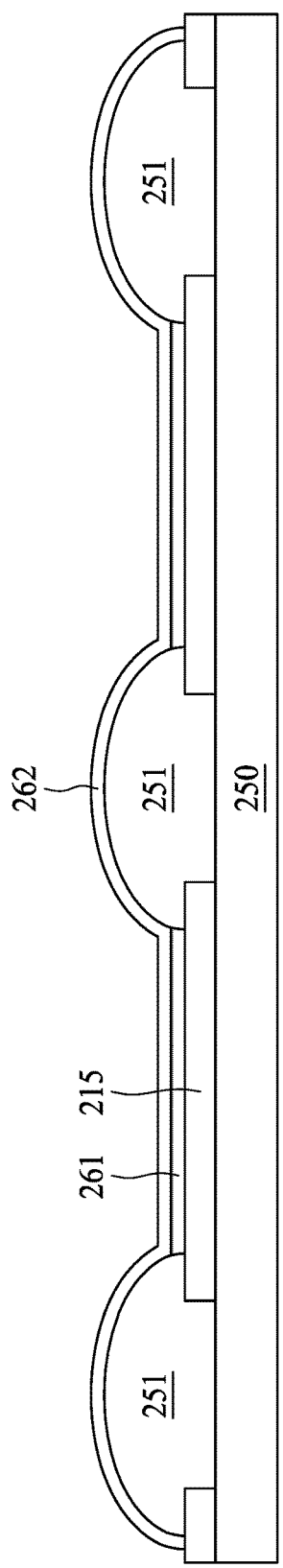

In some embodiments, the carrier injection layer 261 is configured to be broken into segements and the carrier transportation layer 262 is continuously lining along the exposed PDL bumps and the segmented carrier injection layer 261 as shown in FIG. 15F. Each segment is vertically aligned to a first electrode 215. In other words, the carrier injection layer 261 is not continuously lining along the exposed bumps 251 and first electrode 215. Each light emitting unit has a separate carrier injection layer 261 disposed thereon.

Figure 16A:
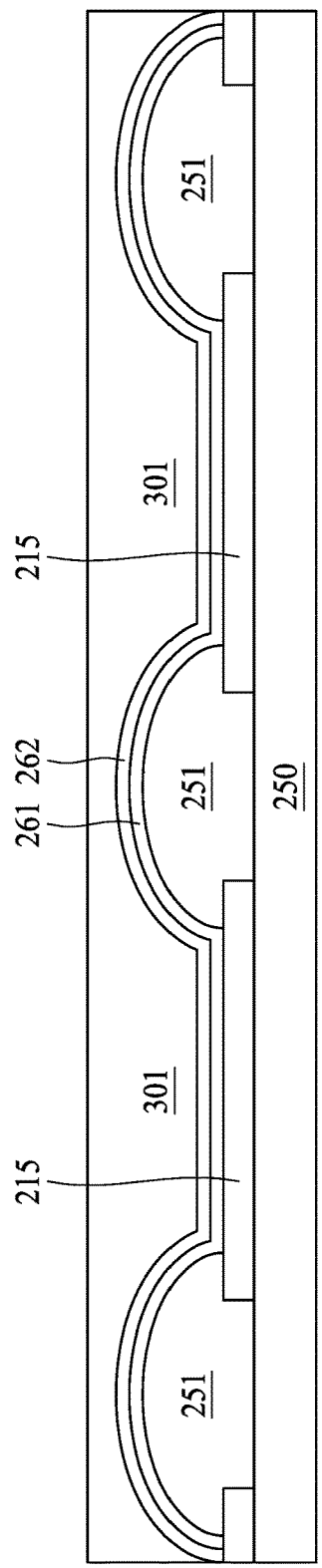
FIG. 16A-16G illustrate a method of manufacturing a light emitting device according to an embodiment.

A buffer layer 301 is disposed over the PDL bumps 251 and also covers the carrier injection layer 261 and carrier transportation layer 262, as shown in FIG. 16A. The buffer layer 301 is used to block moisture penetrating into the PDL bumps 251, and the carrier injection layer 261 and carrier transportation layer 262. In one embodiment, the buffer 301 is disposed by spin coating. The buffer layer 301 can be further heated to a temperature $T_1$. In some embodiments, $T_1$ is about 5° C. to 10° C. below the glass temperature of the carrier injection layer 261 and carrier transportation layer 262. The heating operation is about 1 to 10 minutes. In some embodiments, the buffer layer 301 includes fluorine.

Figure 16B:
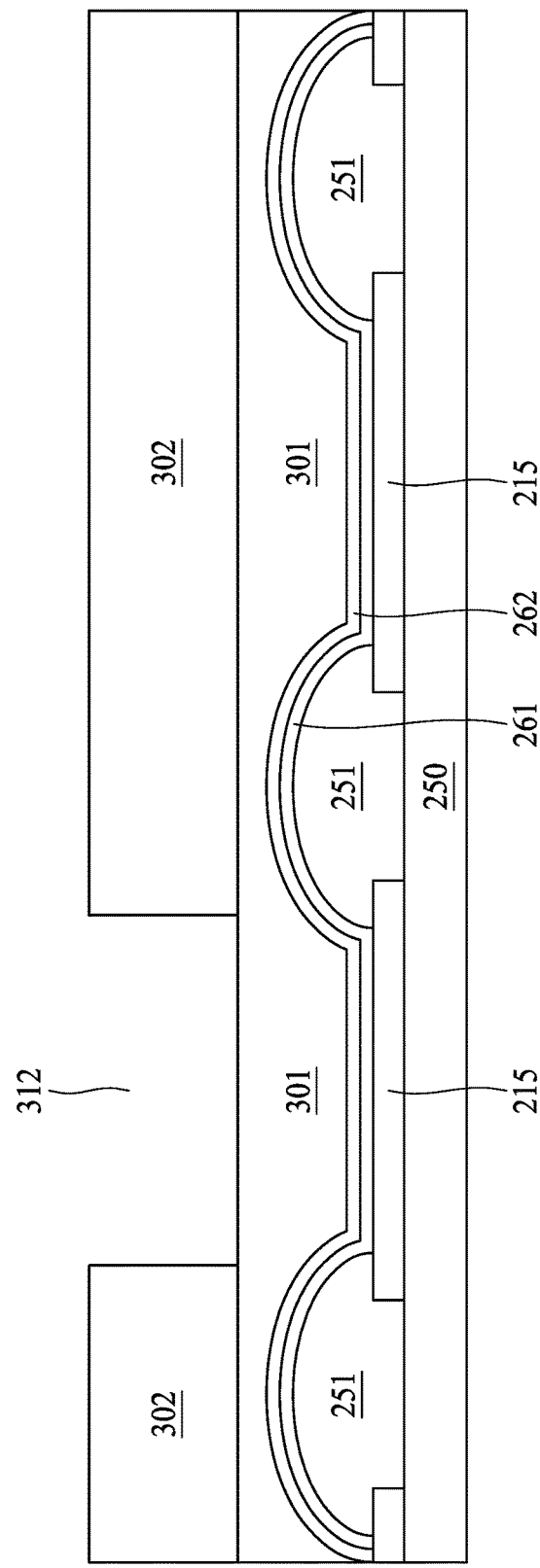
Figure 16C:
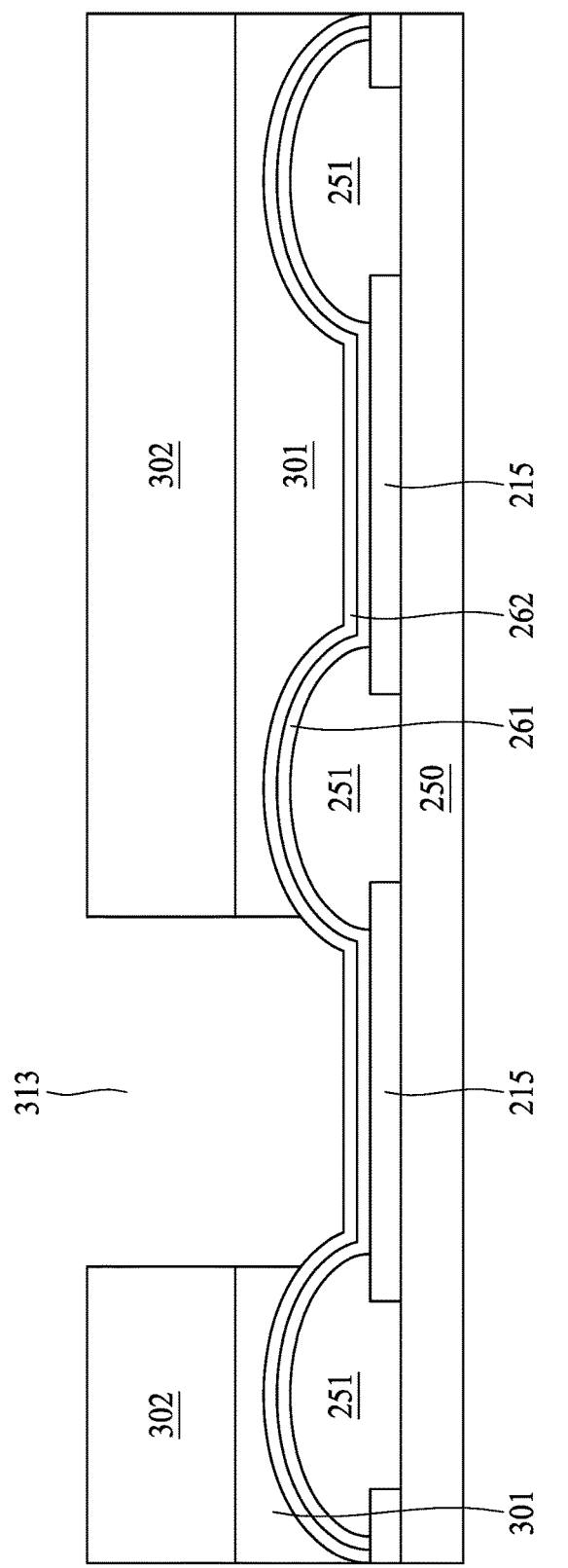

In FIG. 16B, a photosensitive layer 302 is disposed over the buffer layer 301 after the heating operation. The photosensitive layer 302 is further patterned by a lithography process to expose a portion of buffer layer 301 through the recess 312. In FIG. 16C, a portion of the buffer layer 301 is removed to have a recess 313 to expose the carrier transportation layer 262. In some embodiments, the removal operation in FIG. 16C is performed by wet etch.

Figure 16D:
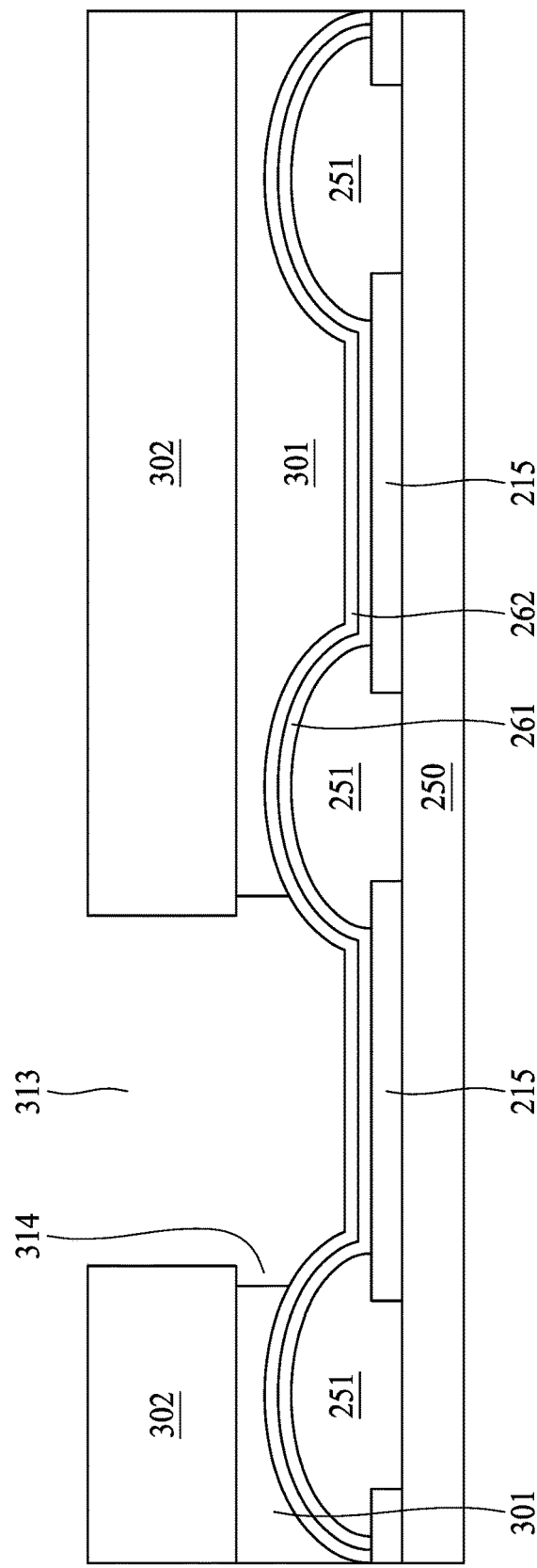

For some embodiments, the removal operation includes at least two steps. The first step is vertical removal and the buffer layer 301 is carved out substantially following the dimention of opening width of the recess 312 as shown in FIG. 16C. After forming the recess 313, a second step is introduced to perform a lateral removal as shown in FIG. 16D. An undercut 314 is formed to expand the recess 313 further into the buffer layer 301 in order to expose more surfaces toward the topmost point of the PDL bump 251.

Figure 16E:
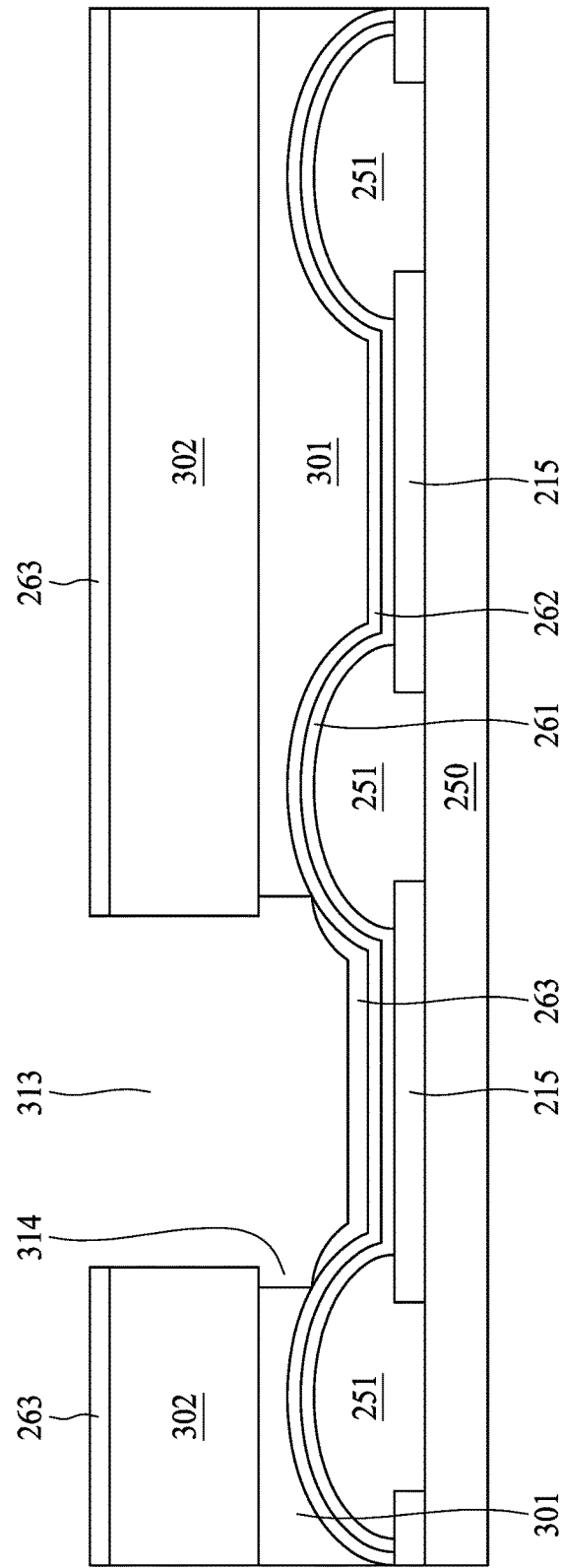

An organic emissive (EM) layer 263 is disposed into the recess 313 and covering the carrier transportation layer 262 and the photosensitive layer 302. In FIG. 16E, the EM layer 263 fully covers the exposed carrier transportation layer 262. The EM layer 263 is configured to emit a first color.

Figure 16F:
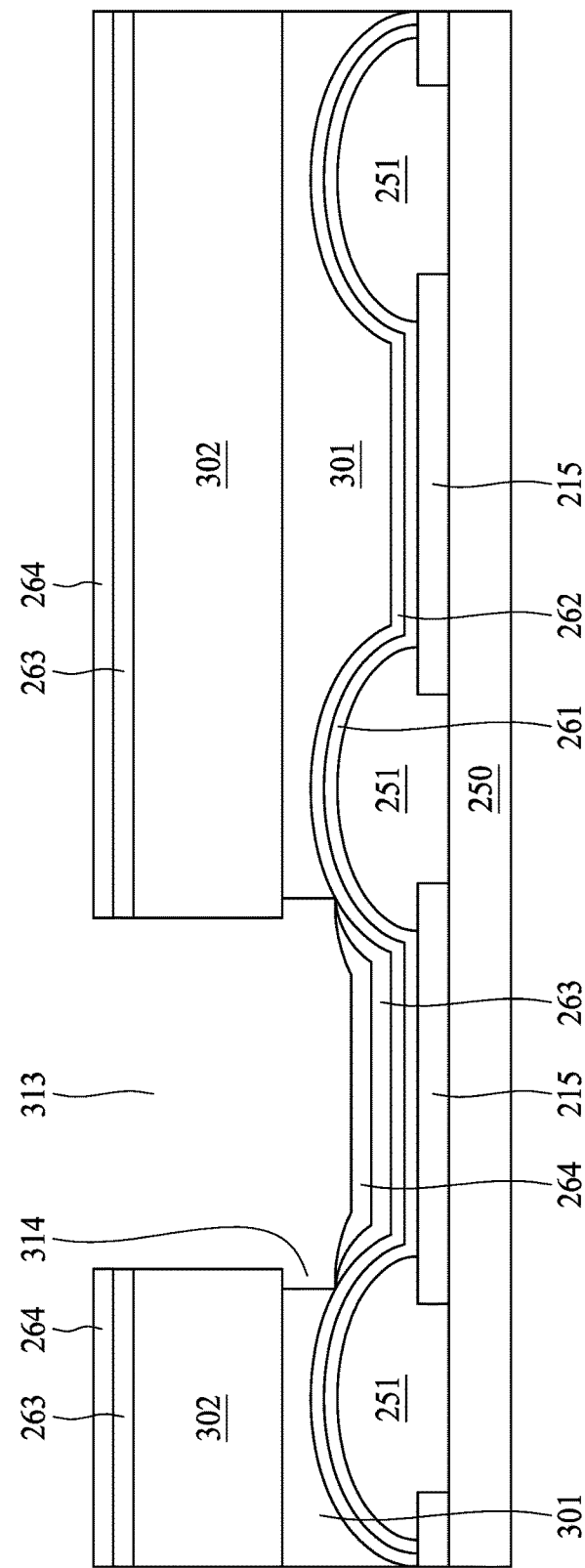

An organic carrier transportation layer 264 (or called second type carrier transportation layer) is disposed over the EM layer 263 as shown in FIG. 16F. The organic carrier transportation layer 264 can be a hole or electron transportation layer 264. In some embodiments, the organic carrier transportation layer 264 and the carrier transportation layer 262 is repectively configured for opposite types of charges.

Figure 16G:
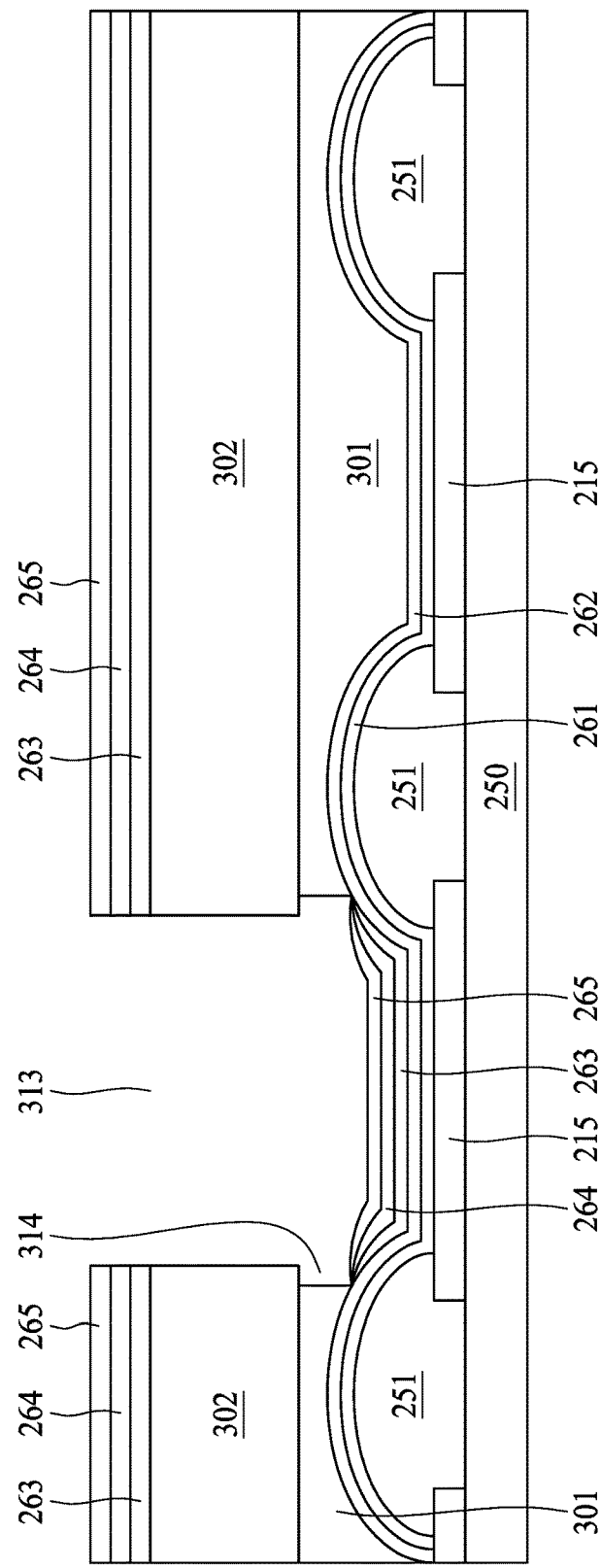

In FIG. 16G, a second electrode 265 can be disposed over the organic carrier transportation layer 264. A top surface of the photosensitive layer 302 is also covered by the second electrode 265. The photosensitive layer 302 can be removed after forming the second electrode 265. The second electrode 265 can be metallic material such as Ag, Mg, etc. In some embodiments, the second electrode 265 includes ITO (indium tin oxide), or IZO (indium zinc oxide). In some embodiments, each light emitting unit has an independent second electrode 265 from a cross sectional point of view and several light emitting units share a common carrier transportation layer 264.

Figure 17A:
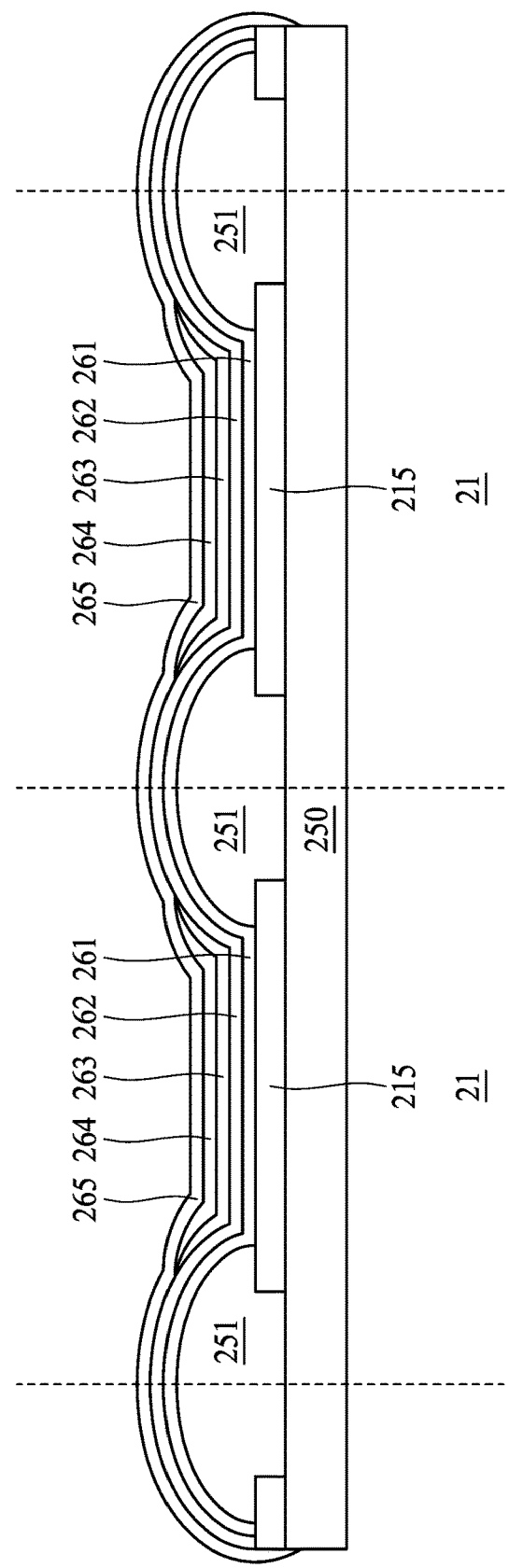
FIG. 17A is cross sectional view of a portion of a light emitting device according to an embodiment.

Similar operations like FIG. 16A-16G can be repeated to form a different colored light emitting unit. FIG. 17A illustrates another light emitting unit emitting a second color, which is different from the first color. The second electrode 265 for the first light emitting unit 21 and the second light emitting unit 22 is continuous. Each light emitting unit has an independent carrier transportation layer 264. The independent carrier transportation layer 264 is segmented to have several pieces and each piece is disposed in one light emitting unit. In some embodiments, several light emitting units share a common carrier transportation layer 264.

Figure 17B:
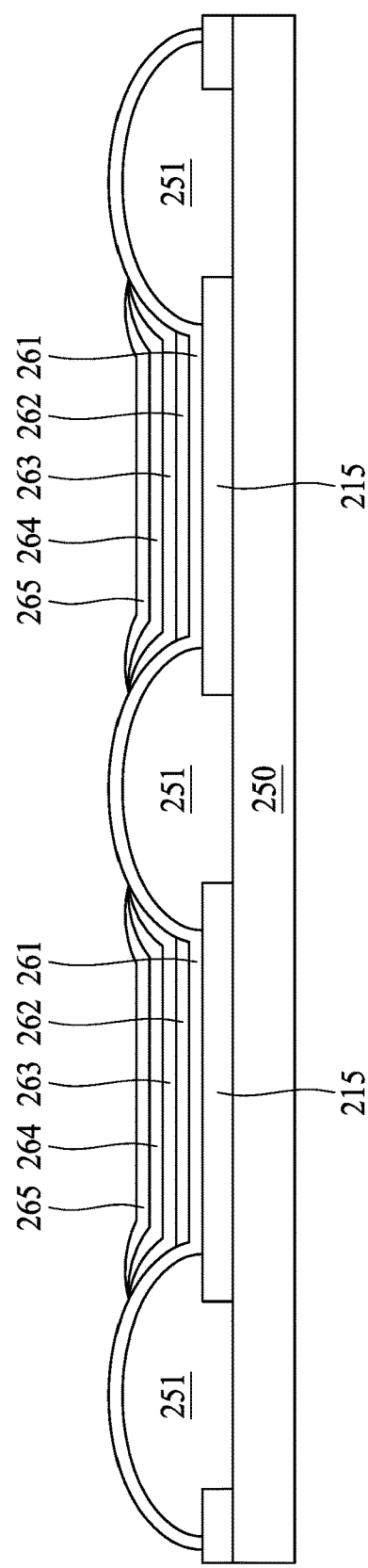
FIG. 17B is cross sectional view of a portion of a light emitting device according to an embodiment.

In some embodiments, each light emitting unit has an independent carrier transportation layer 262 (proximal to the first electrode 215 comparing to the carrier transportation layer 264) as in FIG. 17B. The carrier transportation layer 262 is segmented to have several pieces and each piece is disposed in one light emitting unit. In some embodiments, several light emitting units share a common carrier transportation layer 262. Each light emitting unit has an independent carrier injection layer 261. The carrier injection layer 261 is segmented to have several pieces and each piece is disposed in one light emitting unit. In some embodiments, several light emitting units share a common carrier injection layer 261.

In some embodiments, the second carrier transportation layer 264 has at least two sub-layers. The first sub-layer is between the second sublayer and the EM layer 263. In some embodiments, the second sublayer is between the first sub-layer and the electrode. In some embodiments, both sublayers are continuous and light emitting units 21 and 22 use common first sub-layer and second sublayer. In some embodiments, one sub-layer is segmented and ther other one is continuous. In some embodiments, the first sublayer is continuous and the second sub-layer is segmentd. Each light emitting unit has an independent second sublayer. In some embodiments, the second sub-layer is continuous and the first sub-layer is segmentd. Each light emitting unit has an independent first sub-layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of manufacturing a light emitting device, comprising:
   providing a substrate;
   forming a plurality of photosensitive bumps over the substrate;
   forming a photosensitive layer over the plurality of photosensitive bumps;
   patterning the photosensitive layer to form a recess through the photosensitive layer to expose a surface;

disposing an organic emissive layer on the surface;
removing the patterned photosensitive layer; and
forming a buffer layer between the photosensitive layer and the plurality of photosensitive bumps.

2. The method of manufacturing a light emitting device in claim 1, wherein the buffer layer is organic and includes fluorine.

3. The method of manufacturing a light emitting device in claim 1, further comprising removing a portion of the buffer layer to partially expose the plurality of photosensitive bumps.

4. The method of manufacturing a light emitting device in claim 1, further comprising forming a first electrode between the substrate and the plurality of photosensitive bumps.

5. The method of manufacturing a light emitting device in claim 3, wherein the first electrode is partially covered by the plurality of photosensitive bumps.

6. The method of manufacturing a light emitting device in claim 4 further comprising forming a first type carrier injection layer between the first electrode and the photosensitive layer.

7. The method of manufacturing a light emitting device in claim 1, further comprising forming a carrier transportation layer over the organic emissive layer.

8. The method of manufacturing a light emitting device in claim 5, further comprising forming a first type carrier transporation layer between the first electrode and the photosensitive layer.

9. The method of manufacturing a light emitting device in claim 1, further comprising forming a carrier injection layer over the organic emissive layer.

10. The method of manufacturing a light emitting device in claim 1, further comprising forming a second electrode over the organic emissive layer.

11. The method of manufacturing a light emitting device in claim 1, wherein forming the first electrode is performed before forming the plurality of photosensitive bumps.

12. The method of manufacturing a light emitting device in claim 1, wherein forming the buffer layer is performed before forming the photosensitive layer.

13. The method of manufacturing a light emitting device in claim 1, wherein the buffer layer is formed by spin coating.

14. The method of manufacturing a light emitting device in claim 6, further comprising heating the buffer layer to a temperature about 5° C. to about 10° C. below the glass temperature of the first type carrier injection layer.

15. The method of manufacturing a light emitting device in claim 14, wherein the heating operation of the buffer layer is between about 1 to about 10 minutes.

16. The method of manufacturing a light emitting device in claim 1, further comprising patterning the photosensitive layer to form a recess through the photosensitive layer to expose a portion of the buffer layer.

17. The method of manufacturing a light emitting device in claim 3, wherein removing a portion of the buffer layer is performed by wet etch.

18. The method of manufacturing a light emitting device in claim 17, wherein the buffer layer is carved out following a dimension of an opening width of the recess of the photosensitive layer.

19. The method of manufacturing a light emitting device in claim 1, further comprising forming an undercut into the buffer layer.

20. The method of manufacturing a light emitting device in claim 19, wherein the the undercut is formed toward the topmost point of one of the plurality of photosensitive bumps.

21. The method of manufacturing a light emitting device in claim 1, wherein forming the plurality of photosensitive bumps further comprises forming a photosensitive layer over the substrate, and removing a portion of the photosensitive layer.

22. The method of manufacturing a light emitting device in claim 1, further comprising heating the photosensitive layer to a predetermined temperature, and exposing the photosensitive layer under a designated wavelength.

23. The method of manufacturing a light emitting device in claim 1, further comprising rinsing the photosensitive layer.

24. The method of manufacturing a light emitting device in claim 1, further comprising performing a cleaning operation with a cleaning agent to clean exposed surfaces of the plurality of photosensitive bumps after forming the plurality of photosensitive bumps.

25. The method of manufacturing a light emitting device in claim 24, wherein the cleaning agent is a heated De-Ionized water with a temperature between about 30° C. and about 80° C.

26. The method of manufacturing a light emitting device in claim 24, further comprising introducing ultrasonics into the cleaning agent.

27. The method of manufacturing a light emitting device in claim 24, further comprising performing a heating operation to remove the cleaning agent after the cleaning operation.

28. The method of manufacturing a light emitting device in claim 27, wherein the substrate and the plurality of photosensitive bumps are heated to a temperature between 80° C. and 110° C. during the heating operation.

29. The method of manufacturing a light emitting device in claim 27, wherein an compressed air is introduced to the exposed surfaces to help remove the clean agent during the heating operation.

30. The method of manufacturing a light emitting device in claim 27, further comprising treating the exposed surfaces with an $O_2$, $N_2$, or Ar plasma after the heating operation.

31. The method of manufacturing a light emitting device in claim 27, further comprising treating the exposed surfaces with an ozone gas after the heating operation.

* * * * *